(12) United States Patent
Miyazaki

(10) Patent No.: US 11,881,840 B2
(45) Date of Patent: Jan. 23, 2024

(54) RADIO-FREQUENCY MODULE AND COMMUNICATION DEVICE

(71) Applicant: Murata Manufacturing Co., Ltd., Kyoto (JP)

(72) Inventor: Daisuke Miyazaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 272 days.

(21) Appl. No.: 17/454,636

(22) Filed: Nov. 12, 2021

(65) Prior Publication Data

US 2022/0166407 A1 May 26, 2022

(30) Foreign Application Priority Data

Nov. 25, 2020 (JP) ................. 2020-195398

(51) Int. Cl.
*H03H 9/54* (2006.01)
*H01L 23/66* (2006.01)
(Continued)

(52) U.S. Cl.
CPC ............. *H03H 9/54* (2013.01); *H01L 23/66* (2013.01); *H01L 24/14* (2013.01); *H01L 25/16* (2013.01); *H03F 3/195* (2013.01); *H03H 9/13* (2013.01); *H03H 11/28* (2013.01); *H01L 24/16* (2013.01); *H01L 2223/6655* (2013.01);
(Continued)

(58) Field of Classification Search
CPC . H03H 9/54; H03H 9/13; H03H 11/28; H03H 9/02574; H03H 9/0542; H03H 9/0552; H03H 9/1014; H03H 9/1071; H01L 23/66; H01L 24/14; H01L 25/16; H01L 24/16; H01L 2223/6655; H01L 2224/14155; H01L 2224/16225; H01L 2924/14215; H01L 2224/16235; H01L 2924/15174; H01L 2924/15184; H01L 2924/15311; H01L 2924/181; H01L 2924/19105; H01L 2924/19106; H03F 3/195; H03F 2200/294; H03F 2200/451; H03F 3/72; H03F 2203/7209; H04B 1/40
See application file for complete search history.

(56) References Cited

U.S. PATENT DOCUMENTS

2018/0019730 A1* 1/2018 Takeuchi ............... H03H 9/703
2020/0228073 A1 7/2020 Naniwa

FOREIGN PATENT DOCUMENTS

WO 2019/065419 A1 4/2019

* cited by examiner

*Primary Examiner* — Jung Kim
(74) *Attorney, Agent, or Firm* — Pearne & Gordon LLP

(57) ABSTRACT

When a radio-frequency module is viewed in plan in a thickness direction of a mounting substrate, an electronic component overlaps an IC component. The electronic component includes four or more filters, each of which includes an input terminal and an output terminal. The IC component includes a first switch connected to the input terminals of at least four of the four or more filters and a second switch connected to the output terminals of the at least four filters. The input terminals of the at least four filters are in a first region including a center of the electronic component when viewed in plan in the thickness direction of the mounting substrate. The output terminals of the at least four filters are in a second region between the first region and a perimeter of the electronic component when viewed in plan in the thickness direction of the mounting substrate.

10 Claims, 8 Drawing Sheets

(51) Int. Cl.
*H01L 23/00* (2006.01)
*H03H 9/13* (2006.01)
*H03F 3/195* (2006.01)
*H03H 11/28* (2006.01)
*H01L 25/16* (2023.01)
*H04B 1/40* (2015.01)

(52) U.S. Cl.
CPC ............... *H01L 2224/14155* (2013.01); *H01L 2224/16225* (2013.01); *H01L 2924/14215* (2013.01); *H03F 2200/294* (2013.01); *H03F 2200/451* (2013.01); *H04B 1/40* (2013.01)

RADIO-FREQUENCY MODULE AND COMMUNICATION DEVICE

CROSS REFERENCE TO RELATED APPLICATION

This application claims priority from Japanese Patent Application No. 2020-195398 filed on Nov. 25, 2020. The content of this application is incorporated herein by reference in its entirety.

BACKGROUND

The present disclosure generally relates to a radio-frequency module and a communication device and, more specifically, to a radio-frequency module including a mounting substrate and to a communication device including the radio-frequency module.

A radio-frequency module disclosed in International Publication No. 2019/065419 includes a substrate (mounting substrate), filters, an integrated device, and terminals (external connection terminals). The substrate has a first principal surface and a second principal surface. The filters are mounted on the first principal surface of the substrate. The integrated device and the terminals are mounted on the second principal surface of the substrate.

The integrated device included in the radio-frequency module disclosed in International Publication No. 2019/065419 is an integrated circuit (IC) or an IC component including a first switch and a second switch that are integrated in a single package. The first switch is connected with input terminals of the filters. The second switch is connected with output terminals of the filters.

It is sometimes required that at least four filters whose pass bands are different frequency bands be included in such a radio-frequency module. This requirement may be addressed by the radio-frequency module disclosed in International Publication No. 2019/065419. In this case, the at least four filters are mounted on the first principal surface of the mounting substrate and are discretely located away from each other, and the IC component connected with the input terminals and the output terminals of the filters is mounted on the second principal surface of the mounting substrate. The downside to such a radio-frequency module is that the degree of isolation between the input terminal and the output terminal of each filter may be low.

BRIEF SUMMARY

The present disclosure provides a radio-frequency module and a communication device that afford improved isolation between an input terminal and an output terminal of each of at least four filters.

A radio-frequency module according to an aspect of the present disclosure includes a mounting substrate, an electronic component, an integrated circuit (IC) component, and external connection terminals. The mounting substrate has a first principal surface and a second principal surface on opposite sides. The electronic component is mounted on the first principal surface of the mounting substrate. The IC component is mounted on the second principal surface of the mounting substrate. The external connection terminals are disposed on the second principal surface of the mounting substrate. The electronic component overlaps the IC component when viewed in plan in a thickness direction of the mounting substrate. The electronic component includes four or more filters whose pass bands are different frequency bands. The four or more filters each includes an input terminal and an output terminal. The IC component includes a first switch and a second switch. The first switch is connected to the input terminals of at least four of the four or more filters. The second switch is connected to the output terminals of the at least four filters. The input terminals of the at least four filters are located in a first region including a center of the electronic component when viewed in plan in the thickness direction of the mounting substrate. The output terminals of the at least four filters are located in a second region between the first region and a perimeter of the electronic component when viewed in plan in the thickness direction of the mounting substrate.

A communication device according to another aspect of the present disclosure includes the radio-frequency module and a signal processing circuit. The signal processing circuit is connected to the radio-frequency module.

Other features, elements, characteristics and advantages of the present disclosure will become more apparent from the following detailed description of embodiments of the present disclosure with reference to the attached drawings.

DETAILED DESCRIPTION

Figure 1A:
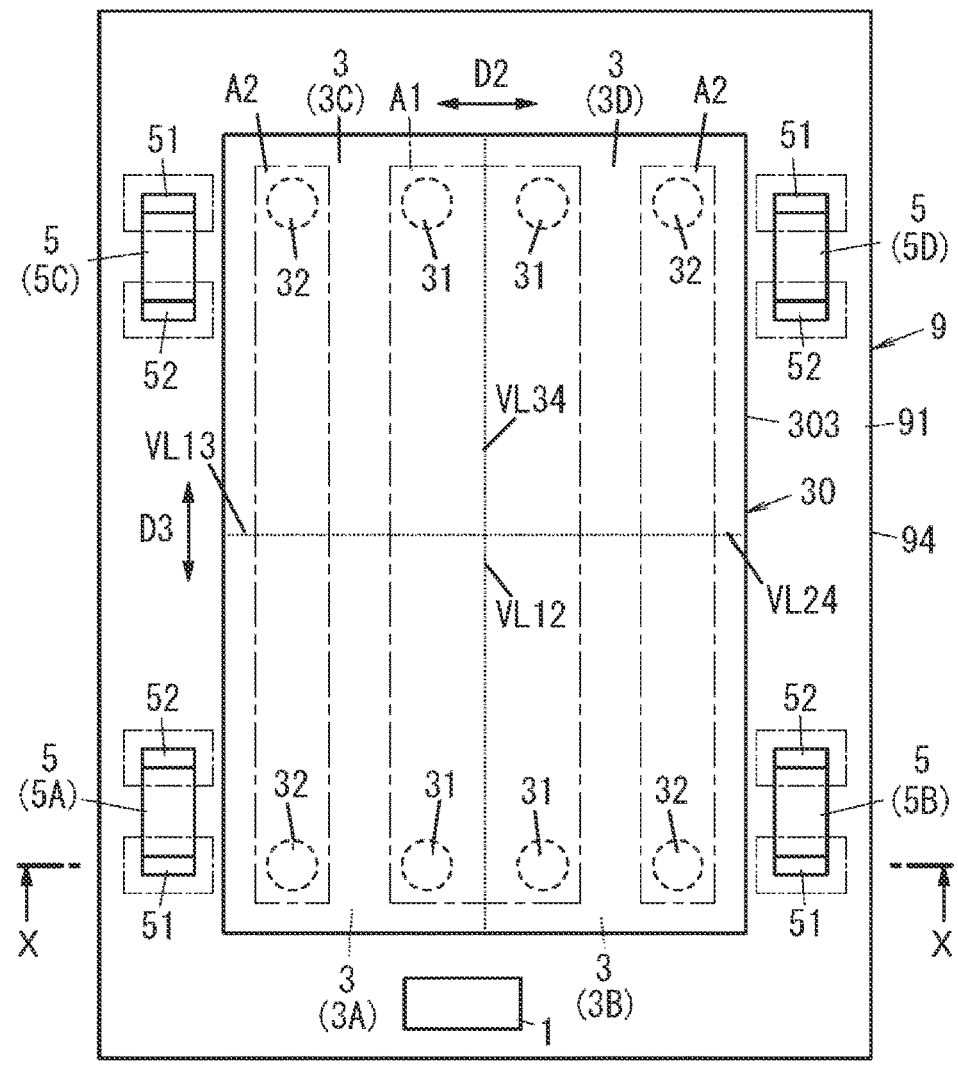
FIG. 1A is a plan view of a radio-frequency module according to an embodiment.

FIGS. 1A, 1B, 2, 3A, 3B, 5, 6, 7, and 8, which will be referred to in relation to an embodiment and the like in the description below, are schematic views; that is, constituent elements are not drawn to scale, and the size and thickness ratios thereof may not fully correspond to the actual dimension ratios.

Embodiment

Referring to FIGS. 1A to 3B, a radio-frequency module 100 according to an embodiment includes a mounting substrate 9, an electronic component 30, an integrated circuit (IC) component 10, and external connection terminals 8. The mounting substrate 9 has a first principal surface 91 and a second principal surface 92 on opposite sides. The electronic component 30 is mounted on the first principal surface 91 of the mounting substrate 9. The IC component 10 is mounted on the second principal surface 92 of the mounting substrate 9. The external connection terminals 8 are disposed on the second principal surface 92 of the mounting substrate 9. The electronic component 30 overlaps the IC component 10 when viewed in plan in D1, which denotes the thickness direction of the mounting substrate 9. The electronic component 30 includes four or more filters whose pass bands are different frequency bands. These filters are denoted by 3. In the example illustrated herein, the electronic component 30 includes four filters 3. The four or more filters 3 each includes an input terminal 31 and an output terminal 32. The IC component 10 includes a first switch 2 (see FIG. 4) and a second switch 4 (see FIG. 4). The first switch 2 is connected to the input terminals 31 of at least four of the four or more filters 3. The second switch 4 is connected to the output terminals 32 of the at least four filters 3.

Figure 4:
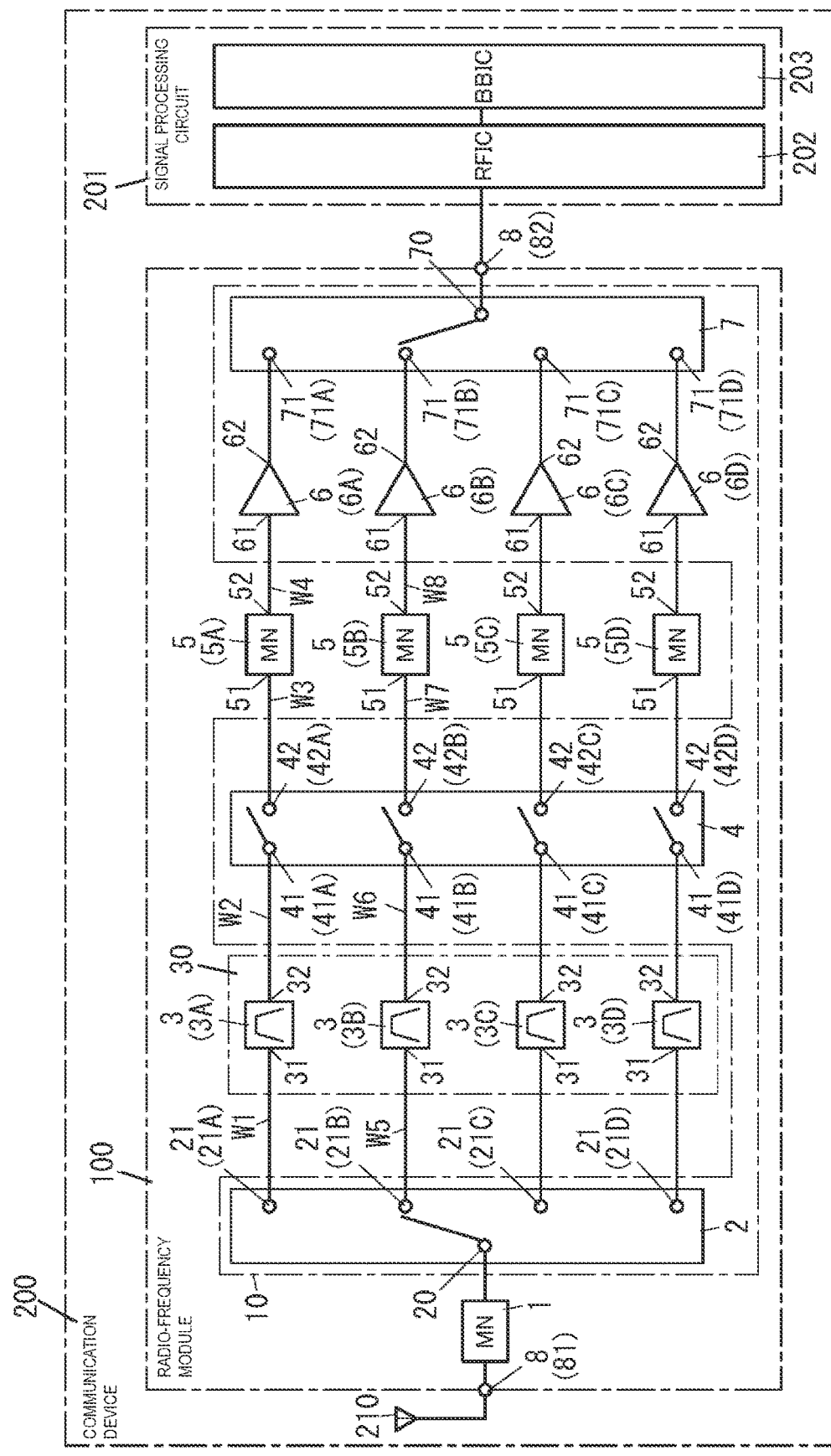
FIG. 4 is a circuit configuration diagram of a communication device including the radio-frequency module.

The IC component 10 of the radio-frequency module 100 includes, in addition to the first switch 2 and the second switch 4, four or more low-noise amplifiers 6 (see FIG. 4). In the example illustrated herein, the IC component 10 includes four low-noise amplifiers 6. The radio-frequency module 100 includes, in addition to the aforementioned constituent elements, four or more matching elements 5. In the example illustrated herein, the radio-frequency module 100 includes four matching elements 5. The four matching elements 5 are mounted on the first principal surface 91 of the mounting substrate 9. Each of the four matching elements 5 is provided for the corresponding one of the four low-noise amplifiers 6. Each of the four low-noise amplifier 6 is connected to the second switch 4 with the corresponding one of the four matching elements 5 therebetween.

Figure 1B:
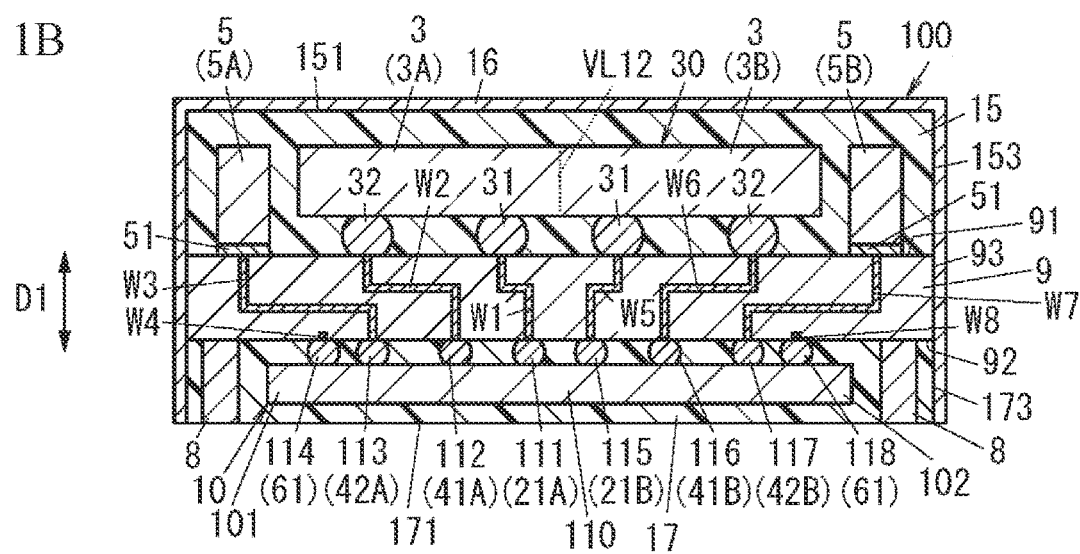
FIG. 1B is a sectional view of the radio-frequency module taken along line X-X in FIG. 1A.

The radio-frequency module 100 includes, in addition to the aforementioned constituent elements, a resin layer 15 (see FIG. 1B). The resin layer 15 is hereinafter also referred to as a first resin layer 15. The first resin layer 15 is disposed on the first principal surface 91 of the mounting substrate 9 and covers the electronic component 30 and the matching elements 5.

The radio-frequency module 100 includes, in addition to the aforementioned constituent elements, a second resin layer 17 (see FIG. 1B). The second resin layer 17 is disposed on the second principal surface 92 of the mounting substrate 9. The second resin layer 17 covers the IC component 10 mounted on the second principal surface 92 of the mounting substrate 9 and also covers peripheral surfaces of the external connection terminals 8.

The radio-frequency module 100 includes, in addition to the aforementioned constituent elements, an electrically conductive (metal electrode) layer 16 (see FIG. 1B). The electrically conductive layer 16 covers a principal surface 151 and a peripheral surface 153 of the first resin layer 15, a peripheral surface 93 of the mounting substrate 9, and a peripheral surface 173 of the second resin layer 17. The principal surface 151 is farther than the other principal surface of the first resin layer 15 from the mounting substrate 9.

Together with a communication device 200, the radio-frequency module 100 according to an embodiment will be described in more detail with reference to FIGS. 1A to 4.
(1) Radio-Frequency Module and Communication Device
(1.1) Circuit Configuration of Radio-Frequency Module and Circuit Configuration of Communication Device The following describes, with reference to FIG. 4, the circuit configuration of the radio-frequency module 100 and the circuit configuration of the communication device 200.

The radio-frequency module 100 may be included in the communication device 200. The communication device 200 is, for example, a mobile phone, such as a smartphone. Alternatively, the communication device 200 may be a wearable terminal, such as a smart watch. The radio-frequency module 100 supports, for example, the fourth-generation mobile communication (4G) standard or the fifth-generation mobile communication (5G) standard. The 4G standard is, for example, the third generation partnership project (3GPP) Long Term Evolution (LTE) standard. The 5G standard is, for example, 5G New Radio (NR). The radio-frequency module 100 supports, for example, carrier aggregation and dual connectivity.

The radio-frequency module 100 is configured to amplify reception signals input through an antenna 210 and to output the resultant signals to a signal processing circuit 201. The signal processing circuit 201 is not a constituent element of the radio-frequency module 100. The signal processing circuit 201 is a constituent element of the communication device 200 including the radio-frequency module 100. The radio-frequency module 100 may be controlled by the signal processing circuit 201 included in the communication device 200. The communication device 200 includes the antenna 210 as well as the radio-frequency module 100 and the signal processing circuit 201. The communication device 200 also includes a circuit board having the radio-frequency module 100 mounted thereon. The circuit board is, for example, a printed wiring board. The circuit board includes a ground electrode that is placed at the ground potential.

The signal processing circuit 201 includes a radio-frequency (RF) signal processing circuit 202 and a baseband signal processing circuit 203. The RF signal processing circuit 202 is, for example, a radio-frequency integrated circuit (RFIC) and processes radio-frequency signals. The RF signal processing circuit 202 performs signal processing such as up-conversion on radio-frequency signals (transmission signals) output by the baseband signal processing circuit 203 and outputs the resultant radio-frequency signals. The RF signal processing circuit 202 also performs signal processing such as down-conversion on radio-frequency signals (reception signals) output by the radio-frequency module 100 and outputs the resultant radio-frequency signals to the baseband signal processing circuit 203. The baseband signal processing circuit 203 is, for example, a baseband integrated circuit (BBIC). The baseband signal processing circuit 203 generates I-phase signals and Q-phase signals from baseband signals. Examples of the baseband signals include audio signals and image signals that are input from the outside. The baseband signal processing circuit 203 performs IQ modulation by combining an I-phase signal with a Q-phase signal and outputs the resultant transmission signal. The transmission signal is a modulating signal (IQ signal) obtained through amplitude modulation performed on a carrier signal of a predetermined frequency, with the modulation period being longer than the period of the carrier signal. The reception signals processed by the baseband signal processing circuit 203 are used, for example, as image signals for displaying an image or as audio signals for a telephone conversation through the communication device 200. The radio-frequency module 100 transmits radio-frequency signals (reception signals and transmission signals) between the antenna 210 and the RF signal processing circuit 202 included in the signal processing circuit 201.

The radio-frequency module 100 includes the four filters 3, the first switch 2, the second switch 4, the four low-noise amplifiers 6, and the four matching elements 5. The radio-frequency module 100 also includes a matching circuit 1 and a third switch 7.

The radio-frequency module 100 includes the external connection terminals 8. The external connection terminals 8 include an antenna terminal 81, a signal output terminal 82, and external ground terminals 85 (see FIG. 2). The external ground terminals 85 are electrically connected to the ground electrode of the circuit board of the communication device 200 and are placed at the ground potential accordingly.

The following describes the circuit configuration of the radio-frequency module 100 in more detail with reference to FIG. 4.

The four filters 3 include the respective input terminals 31 and the respective output terminals 32. The four filters 3 are receiving filters whose pass bands are different frequency bands. To be distinguishable from each other, the four filters 3 may be hereinafter also referred to as a first filter 3A, a second filter 3B, a third filter 3C, and a fourth filter 3D, respectively.

The first filter 3A may be a filter whose pass band is a first frequency band (e.g., a reception band of a first communication band). The second filter 3B may be a filter whose pass band is a second frequency band (e.g., a reception band of a second communication band). The third filter 3C may be a filter whose pass band is a third frequency band (e.g., a reception band of a third communication band). The fourth filter 3D may be a filter whose pass band is a fourth frequency band (e.g., a reception band of a fourth communication band). The first frequency band, the second frequency band, the third frequency band, and the fourth frequency band may each be a communication band specified by the 3GPP LTE standard or a communication band specified by the 5G NR standard. The first frequency band, the second frequency band, the third frequency band, and the fourth frequency band may be four communication bands selected from the group consisting of Band 8, Band 26, Band 20, Band 28A, Band 14, Band 13, Band 12, Band 29, Band 71, Band 28, n5, n8, n71, n12, n14, n20, n26, n28, and n29. The first frequency band, the second frequency band, the third frequency band, and the fourth frequency band in an example are Band 8, Band 26, Band 28A, and Band 28B, respectively. The first frequency band, the second frequency band, the third frequency band, and the fourth frequency band in another example are Band 20, Band 14, Band 12, and Band 13, respectively.

The four low-noise amplifiers 6 each includes an input terminal 61 and an output terminal 62. The four low-noise amplifiers 6 each amplifies a reception signal input to the input terminal 61 and output the resultant signal from the output terminal 62. The input terminals 61 of the four low-noise amplifiers 6 are connected to the second switch 4. The output terminals 62 of the four low-noise amplifiers 6 are connected to the signal output terminal 82, with the third switch 7 being located between the signal output terminal 82 and each of the output terminals 62. The four low-noise amplifiers 6 are connected to the signal processing circuit 201, with the third switch 7 and the signal output terminal 82 being located between the signal processing circuit 201 and each of the four low-noise amplifiers 6. Through the signal output terminal 82, radio-frequency signals (reception signals) from the four low-noise amplifiers 6 are output to an external circuit (e.g., the signal processing circuit 201).

Each of the four low-noise amplifiers 6 is provided for the corresponding one of the four filters 3. To be distinguishable from each other, the four low-noise amplifiers 6 may be hereinafter also referred to as a first low-noise amplifier 6A, a second low-noise amplifier 6B, a third low-noise amplifier 6C, and a fourth low-noise amplifier 6D, respectively. To be distinguishable from each other, the four matching elements 5 may be hereinafter also referred to as a first matching element 5A, a second matching element 5B, a third matching element 5C, and a fourth matching element 5D, respectively.

The input terminal 61 of the first low-noise amplifier 6A is connected to the second switch 4 with the first matching element 5A therebetween. The output terminal 62 of the first low-noise amplifier 6A is connected to the third switch 7. The input terminal 61 of the second low-noise amplifier 6B is connected to the second switch 4 with the second matching element 5B therebetween. The output terminal 62 of the second low-noise amplifier 6B is connected to the third switch 7. The input terminal 61 of the third low-noise amplifier 6C is connected to the second switch 4 with the third matching element 5C therebetween. The output terminal 62 of the third low-noise amplifier 6C is connected to the third switch 7. The input terminal 61 of the fourth low-noise amplifier 6D is connected to the second switch 4 with the fourth matching element 5D therebetween. The output terminal 62 of the fourth low-noise amplifier 6D is connected to the third switch 7.

The four matching elements 5 each includes a first terminal 51 and a second terminal 52. The first matching element 5A is an impedance matching element that provides impedance matching between the first low-noise amplifier 6A and the first filter 3A. The first matching element 5A is, for example, an inductor. The first terminal 51 of the first matching element 5A is connected to the first filter 3A with the second switch 4 therebetween. The second terminal 52 of the first matching element 5A is connected to the input terminal 61 of the first low-noise amplifier 6A. The second matching element 5B is an impedance matching element that provides impedance matching between the second low-noise amplifier 6B and the second filter 3B. The second matching element 5B is, for example, an inductor. The first terminal 51 of the second matching element 5B is connected to the second filter 3B with the second switch 4 therebetween. The second terminal 52 of the second matching element 5B is connected to the input terminal 61 of the second low-noise amplifier 6B. The third matching element 5C is an impedance matching element that provides impedance matching between the third low-noise amplifier 6C and the third filter 3C. The third matching element 5C is, for example, an inductor. The first terminal 51 of the third matching element 5C is connected to the third filter 3C with the second switch 4 therebetween. The second terminal 52 of the third matching element 5C is connected to the input terminal 61 of the third low-noise amplifier 6C. The fourth matching element 5D is an impedance matching element that provides impedance matching between the fourth low-noise amplifier 6D and the fourth filter 3D. The fourth matching element 5D is, for example, an inductor. The first terminal 51 of the fourth matching element 5D is connected to the fourth filter 3D with the second switch 4 therebetween. The second terminal 52 of the fourth matching element 5D is connected to the input terminal 61 of the fourth low-noise amplifier 6D.

The first switch 2 includes a common terminal 20 and four selection terminals 21. To be distinguishable from each other, the four selection terminals 21 may be hereinafter also referred to as a selection terminal 21A, a selection terminal 21B, a selection terminal 21C, and a selection terminal 21D, respectively.

The common terminal 20 of the first switch 2 is connected to the antenna terminal 81 with the matching circuit 1 therebetween. The selection terminal 21A of the first switch 2 is connected to the input terminal 31 of the first filter 3A. The selection terminal 21B of the first switch 2 is connected to the input terminal 31 of the second filter 3B. The selection terminal 21C of the first switch 2 is connected to the input terminal 31 of the third filter 3C. The selection terminal 21D of the first switch 2 is connected to the input terminal 31 of the fourth filter 3D. The first switch 2 is capable of establishing a connection between the common terminal 20 and at least one of the four selection terminals 21. The first switch 2 is capable of establishing one-to-one connections and one-to-many connections.

The first switch 2 may be controlled by the signal processing circuit 201. The first switch 2 performs switching in accordance with a control signal from the RF signal processing circuit 202 included in the signal processing circuit 201 such that the common terminal 20 is connected to or disconnected from at least one of the four selection terminals 21. The first switch 2 is, for example, a switching integrated circuit (IC).

The second switch 4 includes four first terminals 41 and four second terminals 42. To be distinguishable from each other, the four first terminals 41 may be hereinafter also referred to as a first terminal 41A, a first terminal 41B, a first terminal 41C, and a first terminal 41D, respectively. To be distinguishable from each other, the four second terminals 42 may be hereinafter also referred to as a second terminal 42A, a second terminal 42B, a second terminal 42C, and a second terminal 42D, respectively.

The first terminal 41A of the second switch 4 is connected to the output terminal 32 of the first filter 3A. The first terminal 41B of the second switch 4 is connected to the output terminal 32 of the second filter 3B. The first terminal 41C of the second switch 4 is connected to the output terminal 32 of the third filter 3C. The first terminal 41D of the second switch 4 is connected to the output terminal 32 of the fourth filter 3D. The second terminal 42A of the second switch 4 is connected to the first terminal 51 of the first matching element 5A. The second terminal 42B of the second switch 4 is connected to the first terminal 51 of the second matching element 5B. The second terminal 42C of the second switch 4 is connected to the first terminal 51 of the third matching element 5C. The second terminal 42D of the second switch 4 is connected to the first terminal 51 of the fourth matching element 5D. The second switch 4 is capable of establishing a connection between each of the four first terminals 41 and the corresponding one of the second terminals 42.

The second switch 4 may be controlled by the signal processing circuit 201. The second switch 4 performs switching in accordance with a control signal from the RF signal processing circuit 202 included in the signal processing circuit 201 such that each of the first terminals 41 is connected to or disconnected from the corresponding one of the second terminals 42. The second switch 4 is, for example, a switching integrated circuit (IC).

The third switch 7 includes a common terminal 70 and four selection terminals 71. To be distinguishable from each other, the four selection terminals 71 may be hereinafter also referred to as a selection terminal 71A, a selection terminal 71B, a selection terminal 71C, and a selection terminal 71D, respectively.

The common terminal 70 of the third switch 7 is connected to the signal output terminal 82. The selection terminal 71A of the third switch 7 is connected to the output terminal 62 of the first low-noise amplifier 6A. The selection terminal 71B of the third switch 7 is connected to the output terminal 62 of the second low-noise amplifier 6B. The selection terminal 71C of the third switch 7 is connected to the output terminal 62 of the third low-noise amplifier 6C. The selection terminal 71D of the third switch 7 is connected to the output terminal 62 of the fourth low-noise amplifier 6D. The third switch 7 is capable of establishing a connection between the common terminal 70 and at least one of the four selection terminals 71. The third switch 7 is capable of establishing one-to-one connections and one-to-many connections.

The third switch 7 may be controlled by the signal processing circuit 201. The third switch 7 performs switching in accordance with a control signal from the RF signal processing circuit 202 included in the signal processing circuit 201 such that the common terminal 70 is connected to or disconnected from at least one of the four selection terminals 71. The third switch 7 is, for example, a switching integrated circuit (IC).

(1.2) Structure of Radio-Frequency Module

Referring to FIGS. 1A to 3B, the radio-frequency module 100 includes the mounting substrate 9, the electronic component 30, the IC component 10, and the external connection terminals 8. The electronic component 30 includes the four filters 3. The IC component 10 includes the first switch 2 (see FIG. 4) and the second switch 4 (see FIG. 4). The IC component 10 also includes the four low-noise amplifiers 6 (see FIG. 4) and the third switch 7 (see FIG. 4). The radio-frequency module 100 includes the four matching elements 5 and the matching circuit 1 (see FIG. 4).

The mounting substrate 9 has the first principal surface 91 and the second principal surface 92, which are located on opposite sides in the thickness direction D1 of the mounting substrate 9. The mounting substrate 9 is a multilayer substrate including, for example, a plurality of dielectric layers and a plurality of electrically conductive layers. The dielectric layers and the electrically conductive layers are stacked in the thickness direction D1 of the mounting substrate 9. The electrically conductive layers are formed into the respective predetermined patterns. Each of the electrically conductive layers includes one or more conductor portions in a plane orthogonal to the thickness direction D1 of the mounting substrate 9. The electrically conductive layers may, for example, be made of copper. The electrically conductive layers include a ground layer. The mounting substrate 9 of the radio-frequency module 100 includes, for example, via conductors, each of which forms an electrical connection between the ground layer and the corresponding one of the external ground terminals 85. The mounting substrate 9 is, for example, a low-temperature co-fired ceramic (LTCC) substrate. It is not required that the mounting substrate 9 be an LTCC substrate. The mounting substrate 9 may be a printed wiring board, a high-temperature co-fired ceramic (HTCC) substrate, or a resin multilayer substrate.

Alternatively, the mounting substrate 9 may be a wiring structure. The wiring structure may be a multilayer structure. The multilayer structure includes at least one insulating layer and at least one electrically conductive layer. The at least one insulating layer is formed into a predetermined pattern. In a case that two or more insulating layers are included in the multilayer structure, the insulating layers are formed into the respective predetermined patterns. The at least one electrically conductive layer is formed into a predetermined pattern different from that of the at least one insulating layer. In a case that two or more electrically conductive layers are included in the multilayer structure, the electrically conductive layers are formed into the respective predetermined patterns. The at least one electrically conductive layer may include one or more redistribution portions. The wiring structure has two surfaces that are located on opposite sides in the thickness direction of the multilayer structure. One of the two surfaces is a first surface that is the equivalent of the first principal surface 91 of the mounting substrate 9, and the other surface is a second surface that is the equivalent of the second principal surface 92 of the mounting substrate 9. The wiring structure may be an interposer. The interposer that is used as the wiring structure may be a silicon substrate or a multilayer substrate.

The first principal surface 91 and the second principal surface 92 of the mounting substrate 9 are separate from each other in the thickness direction D1 of the mounting substrate 9 and cross the thickness direction D1 of the mounting substrate 9. The first principal surface 91 of the mounting substrate 9 may, for example, be orthogonal to the thickness direction D1 of the mounting substrate 9. Alternatively, the first principal surface 91 may be a surface that is not orthogonal to the thickness direction D1; that is, the first principal surface 91 may include, for example, side surfaces of the conductor portion(s). The second principal surface 92 of the mounting substrate 9 may, for example, be orthogonal to the thickness direction D1 of the mounting substrate 9. Alternatively, the second principal surface 92 may be a surface that is not orthogonal to the thickness direction D1; that is, the second principal surface 92 may include, for example, side surfaces of the conductor portion (s). The first principal surface 91 and the second principal surface 92 of the mounting substrate 9 may have fine irregularities, a recess, or a projection. In a case that the first principal surface 91 of the mounting substrate 9 has a recess, inner surfaces (a bottom surface and an inner peripheral surface) of the recess are included in the first principal surface.

Some of the circuit components of the radio-frequency module 100 belong to a first group. The circuit components in the first group are mounted on the first principal surface 91 of the mounting substrate 9. Referring to FIG. 1A, the four matching elements 5 and the electronic component 30 including the four filters 3 belong to the first group. Likewise, circuit components of the matching circuit 1 belong to the first group. As stated above, these circuit components are mounted on the first principal surface 91 of the mounting substrate 9. This implies, for example, that the circuit components are disposed on (i.e., mechanically connected to) the first principal surface 91 of the mounting substrate 9 or are electrically connected to (the relevant conductor portions of) the mounting substrate 9. The IC component 10 of the radio-frequency module 100 is mounted on the second principal surface 92 of the mounting substrate 9. As has been already described, the IC component 10 includes the four low-noise amplifiers 6, the first switch 2, the second switch 4, and the third switch 7. As stated above, the IC component 10 is mounted on the second principal surface 92 of the mounting substrate 9. This implies, for example, that the IC component 10 is disposed on (i.e., mechanically connected to) the second principal surface 92 of the mounting substrate 9 or is electrically connected to (the relevant conductor portions of) the mounting substrate 9.

The four filters 3 are, for example, ladder filters each including series-arm resonators and parallel-arm resonators. In the example illustrated herein, each filter 3 includes four series-arm resonators and three parallel-arm resonators. The four filters 3 are, for example, acoustic wave filters. Series-arm resonators and parallel-arm resonators included in the acoustic wave filters are acoustic wave resonators. The acoustic wave filters are, for example, surface acoustic wave filters that use surface acoustic waves. Series-arm resonators and parallel-arm resonators included in the surface acoustic wave filters are, for example, surface acoustic wave (SAW) resonators.

As illustrated in FIGS. 1A and 1B, the electronic component 30 including the four filters 3 is mounted on the first principal surface 91 of the mounting substrate 9. The perimeter of the electronic component 30 viewed in plan in the thickness direction D1 of the mounting substrate 9 is quadrilateral and is denoted by 303. The four filters 3 of the electronic component 30 are arranged in a two-by-two matrix when viewed in plan in the thickness direction D1 of the mounting substrate 9. Imaginary boundary lines between two adjacent ones of the four filters 3 are shown in FIGS. 1A, 1B, 3A, and 3B and are denoted by VL12, VL34, VL13, and VL24, respectively. The boundary line VL12 is an imaginary boundary between the first filter 3A and the second filter 3B. The boundary line VL34 is an imaginary boundary between the third filter 3C and the fourth filter 3D. The boundary line VL13 is an imaginary boundary between the first filter 3A and the third filter 3C. The boundary line VL24 is an imaginary boundary between the second filter 3B and the fourth filter 3D.

Figure 3A:
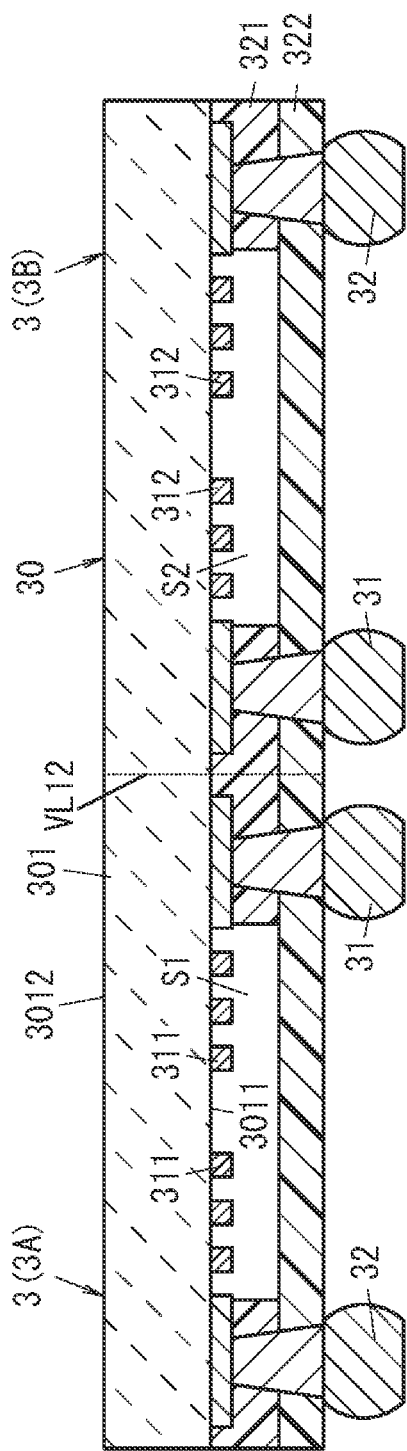
FIGS. 3A and 3B are sectional views of an electronic component included in the radio-frequency module.
Figure 3B:
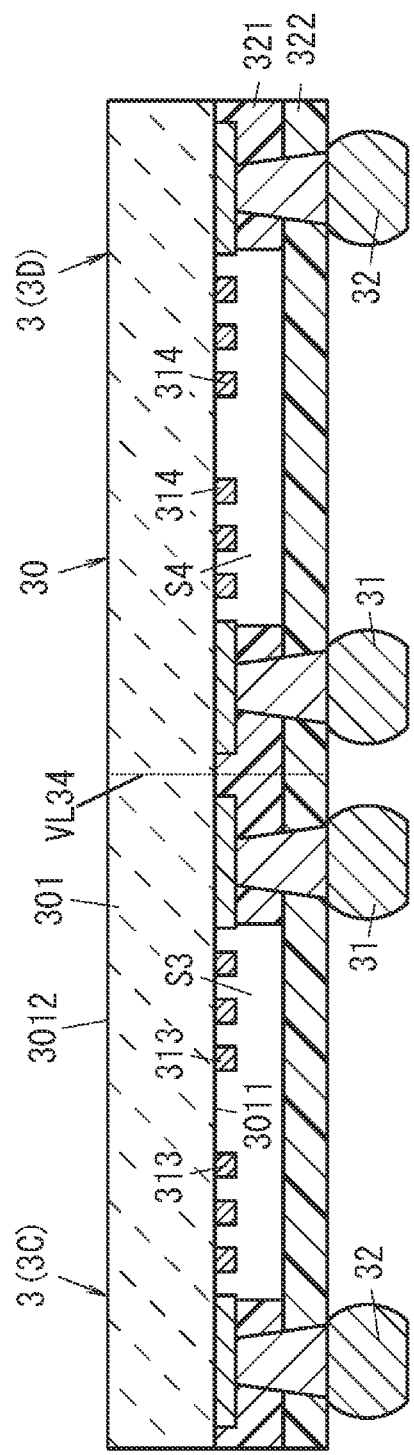

Referring to FIGS. 3A and 3B, the electronic component 30 includes a piezoelectric effect exhibiting substrate 301, which is shared by the four filters 3. The first filter 3A includes first interdigital transducer (IDT) electrodes 311 on the piezoelectric effect exhibiting substrate 301. The second filter 3B includes second IDT electrodes 312 on the piezoelectric effect exhibiting substrate 301. The third filter 3C includes third IDT electrodes 313 on the piezoelectric effect exhibiting substrate 301. The fourth filter 3D includes fourth IDT electrodes 314 on the piezoelectric effect exhibiting substrate 301. The first IDT electrodes 311 of the first filter 3A are constituent elements of SAW resonators. The second IDT electrodes 312 of the second filter 3B are constituent elements of SAW resonators. The third IDT electrodes 313 of the third filter 3C are constituent elements of SAW resonators. The fourth IDT electrodes 314 of the fourth filter 3D are constituent elements of SAW resonators.

The piezoelectric effect exhibiting substrate 301 is a piezoelectric substrate, such as a lithium tantalate substrate or a lithium niobate substrate. The piezoelectric effect exhibiting substrate 301 has a first principal surface 3011 and a second principal surface 3012, which are located on opposite sides in the thickness direction of the piezoelectric effect exhibiting substrate 301. The electronic component 30 has a package structure that includes a spacer layer 321, a cover member 322, the input terminal 31 and the output terminal 32 of the first filter 3A, the input terminal 31 and the output terminal 32 of the second filter 3B, the input terminal 31 and the output terminal 32 of the third filter 3C, and the input terminal 31 and the output terminal 32 of the fourth filter 3D. The electronic component 30 also includes a ground terminal of the first filter 3A, a ground terminal of the second filter 3B, a ground terminal of the third filter 3C, and a ground terminal of the fourth filter 3D.

The spacer layer 321 is disposed on the first principal surface 3011 of the piezoelectric effect exhibiting substrate 301. The spacer layer 321 surrounds the first IDT electrodes 311, the second IDT electrodes 312, the third IDT electrodes 313, and the fourth IDT electrodes 314 when viewed in plan in the thickness direction of the piezoelectric effect exhibiting substrate 301. The spacer layer 321 includes a frame portion that is substantially rectangular in shape when viewed in plan in the thickness direction of the piezoelectric effect exhibiting substrate 301. The frame portion extends along the perimeter of the piezoelectric effect exhibiting substrate 301. The spacer layer 321 has electrical insulation properties. The spacer layer 321 is made of, for example, an epoxy resin or polyimide. The cover member 322 is flat and plate-like in shape. The cover member 322 is disposed on the spacer layer 321 and faces the piezoelectric effect exhibiting substrate 301 in the thickness direction of the piezoelectric effect exhibiting substrate 301. The first IDT electrodes 311, the second IDT electrodes 312, the third IDT electrodes 313, and the fourth IDT electrodes 314 are located within the cover member 322 when viewed in the thickness direction of the piezoelectric effect exhibiting substrate 301. The cover member 322 is located away from the first IDT electrodes 311, the second IDT electrodes 312, the third IDT electrodes 313, and the fourth IDT electrodes 314 in the thickness direction of the piezoelectric effect exhibiting substrate 301. The cover member 322 has electrical insulation properties. The cover member 322 is made of, for example, an epoxy resin or polyimide. The first filter 3A includes a first space S1, which is located between the cover member 322 and the first IDT electrodes 311 on the piezoelectric effect exhibiting substrate 301. The second filter 3B includes a second space S2, which is located between the cover member 322 and the second IDT electrodes 312 on the piezoelectric effect exhibiting substrate 301. The third filter 3C includes a third space S3, which is located between the cover member 322 and the third IDT electrodes 313 on the piezoelectric effect exhibiting substrate 301. The fourth filter 3D includes a fourth space S4, which is located between the cover member 322 and the fourth IDT electrodes 314 on the piezoelectric effect exhibiting substrate 301. The input terminal 31 and the output terminal 32 of the first filter 3A are exposed at a surface of the cover member 322. The input terminal 31 and the output terminal 32 of the second filter 3B are exposed at the surface of the cover member 322. The input terminal 31 and the output terminal 32 of the third filter 3C are exposed at the surface of the cover member 322. The input terminal 31 and the output terminal 32 of the fourth filter 3D are exposed at the surface of the cover member 322.

The four matching elements 5 include the respective first terminals 51 and the respective second terminals 52. The matching elements 5 are mounted on the first principal surface 91 of the mounting substrate 9. The matching elements 5 are inductors. More specifically, the matching elements 5 are, for example, chip inductors. The perimeter of each of the four matching elements 5 viewed in plan in the thickness direction D1 of the mounting substrate 9 is quadrilateral.

Figure 2:
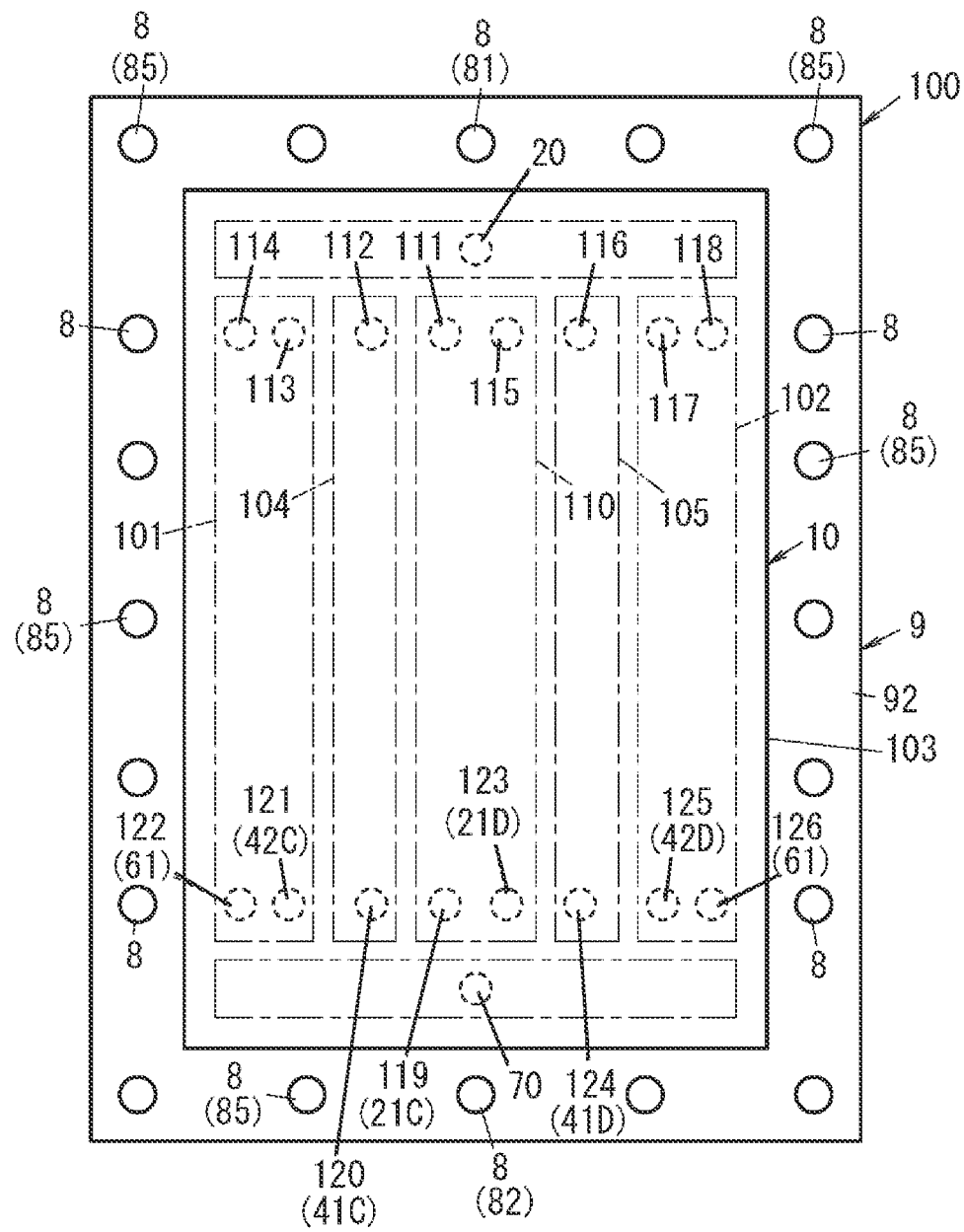
FIG. 2 is a bottom view of the radio-frequency module.

As illustrated in FIGS. 1B and 2, the IC component 10 is mounted on the second principal surface 92 of the mounting substrate 9. The perimeter of the IC component 10 viewed in plan in the thickness direction D1 of the mounting substrate 9 is quadrilateral and is denoted by 103. The IC component 10 is, for example, an IC chip including a substrate and integrated circuitry. The substrate has a first principal surface and a second principal surface on opposite sides. The integrated circuitry is disposed on the first principal surface of the substrate. The substrate is, for example, a silicon substrate. The integrated circuitry includes circuit portions of the four low-noise amplifiers 6, a circuit portion of the first switch 2, a circuit portion of the second switch 4, and a circuit portion of the third switch 7. The four low-noise amplifiers 6 include, in the respective circuit portions, amplifier transistors, each of which is provided for the corresponding one of the low-noise amplifiers 6. Each amplifier transistor amplifies a reception signal input to the input terminal 61 of the corresponding low-noise amplifier 6. The amplifier transistors are field effect transistors (FETs). In some embodiments, the amplifier transistors may be bipolar transistors. The circuit portion of the first switch 2 includes four first switching elements. The first switching elements are, for example, FETs. The circuit portion of the second switch 4 includes four second switching elements.

The second switching elements are, for example, FETs. The circuit portion of the third switch 7 includes four third switching elements. The third switching elements are, for example, FETs. The IC component 10 is mounted on the second principal surface 92 of the mounting substrate 9 by flip-chip mounting in such a manner that the first principal surface of the substrate of the IC component 10 faces the second principal surface 92 of the mounting substrate 9.

The IC component 10 includes multiple outer electrodes. Referring to 1B, the outer electrodes include a first outer electrode 111, a second outer electrode 112, a third outer electrode 113, a fourth outer electrode 114, a fifth outer electrode 115, a sixth outer electrode 116, a seventh outer electrode 117, and an eighth outer electrode 118. The first outer electrode 111 is connected to the input terminal 31 of the first filter 3A. The first outer electrode 111 is the selection terminal 21A of the first switch 2. The second outer electrode 112 is connected to the output terminal 32 of the first filter 3A. The second outer electrode 112 is the first terminal 41A of the second switch 4. The third outer electrode 113 is connected to the first matching element 5A. The third outer electrode 113 is the second terminal 42A of the second switch 4. The fourth outer electrode 114 is connected to the first low-noise amplifier 6A. The fourth outer electrode 114 is the input terminal 61 of the first low-noise amplifier 6A. The fifth outer electrode 115 is connected to the input terminal 31 of the second filter 3B. The fifth outer electrode 115 is the selection terminal 21B of the first switch 2. The sixth outer electrode 116 is connected to the output terminal 32 of the second filter 3B. The sixth outer electrode 116 is the first terminal 41B of the second switch 4. The seventh outer electrode 117 is connected to the second matching element 5B. The seventh outer electrode 117 is the second terminal 42B of the second switch 4. The eighth outer electrode 118 is connected to the second low-noise amplifier 6B. The eighth outer electrode 118 is the input terminal 61 of the second low-noise amplifier 6B.

The conductor portions and the via conductors of the mounting substrate 9 constitute traces, some of which are illustrated in FIGS. 1B and 4 and are herein referred to as a first trace W1, a second trace W2, a third trace W3, a fourth trace W4, a fifth trace W5, a sixth trace W6, a seventh trace W7, and an eighth trace W8, respectively. The first trace W1 forms a connection between the first outer electrode 111 of the IC component 10 (i.e., the selection terminal 21A of the first switch 2) and the input terminal 31 of the first filter 3A. The second trace W2 forms a connection between the output terminal 32 of the first filter 3A and the second outer electrode 112 of the IC component 10 (i.e., the first terminal 41A of the second switch 4). The third trace W3 forms a connection between the third outer electrode 113 of the IC component 10 (i.e., the second terminal 42A of the second switch 4) and the first terminal 51 of the first matching element 5A. The fourth trace W4 forms a connection between the second terminal 52 of the first matching element 5A and the fourth outer electrode 114 of the IC component 10 (i.e., the input terminal 61 of the first low-noise amplifier 6A). The fifth trace W5 forms a connection between the fifth outer electrode 115 of the IC component 10 (i.e., the selection terminal 21B of the first switch 2) and the input terminal 31 of the second filter 3B. The sixth trace W6 forms a connection between the output terminal 32 of the second filter 3B and the sixth outer electrode 116 of the IC component 10 (i.e., the first terminal 41B of the second switch 4). The seventh trace W7 forms a connection between the seventh outer electrode 117 of the IC component 10 (i.e., the second terminal 42B of the second switch 4) and the first terminal 51 of the second matching element 5B. The eighth trace W8 forms a connection between the second terminal 52 of the second matching element 5B and the eighth outer electrode 118 of the IC component 10 (i.e., the input terminal 61 of the second low-noise amplifier 6B).

The outer electrodes of the IC component 10 also include a ninth outer electrode 119, a tenth outer electrode 120, an eleventh outer electrode 121, a twelfth outer electrode 122, a thirteenth outer electrode 123, a fourteenth outer electrode 124, a fifteenth outer electrode 125, and a sixteenth outer electrode 126 (see FIG. 2). The ninth outer electrode 119 is connected to the input terminal 31 of the third filter 3C. The ninth outer electrode 119 is the selection terminal 21C of the first switch 2. The tenth outer electrode 120 is connected to the output terminal 32 of the third filter 3C. The tenth outer electrode 120 is the first terminal 41C of the second switch 4. The eleventh outer electrode 121 is connected to the third matching element 5C. The eleventh outer electrode 121 is the second terminal 42C of the second switch 4. The twelfth outer electrode 122 is connected to the third low-noise amplifier 6C. The twelfth outer electrode 122 is the input terminal 61 of the third low-noise amplifier 6C. The thirteenth outer electrode 123 is connected to the input terminal 31 of the fourth filter 3D. The thirteenth outer electrode 123 is the selection terminal 21D of the first switch 2. The fourteenth outer electrode 124 is connected to the output terminal 32 of the fourth filter 3D. The fourteenth outer electrode 124 is the first terminal 41D of the second switch 4. The fifteenth outer electrode 125 is connected to the fourth matching element 5D. The fifteenth outer electrode 125 is the second terminal 42D of the second switch 4. The sixteenth outer electrode 126 is connected to the fourth low-noise amplifier 6D. The sixteenth outer electrode 126 is the input terminal 61 of the fourth low-noise amplifier 6D.

The outer electrodes of the IC component 10 also include ground electrodes or, more specifically, a ground electrode of the first switch 2, a ground electrode of the second switch 4, a ground electrode of the third switch 7, and ground electrodes of the four low-noise amplifiers 6.

As illustrated in FIGS. 1B and 2, the external connection terminals 8 are disposed on the second principal surface 92 of the mounting substrate 9. This implies, for example, that the external connection terminals 8 are mechanically connected to the second principal surface 92 of the mounting substrate 9 or are electrically connected to (the relevant conductor portions of) the mounting substrate 9. The external connection terminals 8 are made of metal, such as copper or a copper alloy. The external connection terminals 8 are columnar electrodes. Each of the columnar electrodes may be in the form of a substantially circular cylinder. The external connection terminals 8 are soldered to the conductor portions of the mounting substrate 9. Alternatively, the external connection terminals 8 may be bonded to the conductor portions with a conductive adhesive, such as a conductive paste, or may be connected directly to the conductor portions.

The external connection terminals 8 include the antenna terminal 81, the signal output terminal 82, and the external ground terminals 85. The external ground terminals 85 are electrically connected the ground layer of the mounting substrate 9. The ground layer is a circuit ground of the radio-frequency module 100. The ground layer is electrically connected with the ground terminals of the four filters 3. The ground layer is also electrically connected with the electrically conductive layer 16 and with the ground electrodes included in the IC component 10.

The first resin layer 15 is disposed on the first principal surface 91 of the mounting substrate 9. The first resin layer 15 covers the electronic component 30 and the four matching elements 5. More specifically, the first resin layer 15 covers a peripheral surface of the electronic component 30, a principal surface of the electronic component 30 farther than the other principal surface of the electronic component 30 from the mounting substrate 9 (i.e., the second principal surface 3012 of the piezoelectric effect exhibiting substrate 301), peripheral surfaces of the four matching elements 5, and principal surfaces of the matching elements 5 farther than the other principal surfaces of the matching elements 5 from the mounting substrate 9. The first resin layer 15 is made of resin, such as an epoxy resin. The first resin layer 15 may be made of a mixture of resin and filler.

The second resin layer 17 covers the IC component 10 mounted on the second principal surface 92 of the mounting substrate 9 and also covers the peripheral surfaces of the external connection terminals 8. The second resin layer 17 is made of resin, such as an epoxy resin. The second resin layer 17 may be made of a mixture of resin and filler. The second resin layer 17 and the first resin layer 15 may be made of the same material or made be made of different materials.

The electrically conductive layer 16 covers the first resin layer 15. The electrically conductive layer 16 has electrical conductivity. The electrically conductive layer 16 of the radio-frequency module 100 is intended for providing electromagnetic shielding inside and outside the radio-frequency module 100. The electrically conductive layer 16 has a multilayer structure including metal layers stacked on top of each other. In some embodiments, the electrically conductive layer 16 may be a single metal layer. Each metal layer may be made of one or more metals. The electrically conductive layer 16 covers the principal surface 151 and the peripheral surface 153 of the first resin layer 15 and the peripheral surface 93 of the mounting substrate 9. The principal surface 151 is farther than the other principal surface of the first resin layer 15 from the mounting substrate 9. The electrically conductive layer 16 also covers the peripheral surface 173 of the second resin layer 17. The electrically conductive layer 16 is in contact with at least part of a peripheral surface of the ground layer of the mounting substrate 9. The electrically conductive layer 16 and the ground layer are placed at the same potential accordingly.

(1.3) Layout in Radio-Frequency Module

The electronic component 30 overlaps the IC component 10 when the radio-frequency module 100 is viewed in plan in the thickness direction D1 of the mounting substrate 9 (see FIG. 1B). The electronic component 30 is entirely located within the IC component 10 when the radio-frequency module 100 is viewed in plan in the thickness direction D1 of the mounting substrate 9. The perimeter 303 of the electronic component 30 and the perimeter 103 of the IC component 10 are each substantially rectangular in shape when the radio-frequency module 100 is viewed in plan in the thickness direction D1 of the mounting substrate 9. The long sides of the electronic component 30 are shorter than the long sides of the IC component 10, and the short sides of the electronic component 30 are shorter than the short sides of the IC component 10. When the radio-frequency module 100 is viewed in plan in the thickness direction D1 of the mounting substrate 9, the center of the electronic component 30 and the center of the IC component 10 coincide with each other, and the long sides of the electronic component 30 and the long sides of the IC component 10 extend in parallel. In some embodiments, the electronic component 30 may extend over the entirety of the IC component 10. Alternatively, part of the electronic component 30 may extend over part or the entirety of the IC component 10.

The first filter 3A and the second filter 3B of the electronic component 30 are arranged side by side in a second direction D2, which is orthogonal to the thickness direction D1 (first direction) of the mounting substrate 9 (see FIG. 1A). Likewise, the third filter 3C and the fourth filter 3D of the electronic component 30 are arranged side by side in the second direction D2. The first filter 3A and the third filter 3C of the electronic component 30 are arranged side by side in a third direction D3, which is orthogonal to the first direction and the second direction D2 (see FIG. 1A). Likewise, the second filter 3B and the fourth filter 3D of the electronic component 30 are arranged side by side in the third direction D3.

The electronic component 30 extends past the center of the mounting substrate 9 when viewed in plan in the thickness direction D1 of the mounting substrate 9. The first matching element 5A and the second matching element 5B are each located between the electronic component 30 and a perimeter 94 of the mounting substrate 9 when viewed in plan in the thickness direction D1 of the mounting substrate 9. Likewise, the third matching element 5C and the fourth matching element 5D are each located between the electronic component 30 and the perimeter 94 of the mounting substrate 9 when viewed in plan in the thickness direction D1 of the mounting substrate 9. The center of the mounting substrate 9 viewed in plan in the thickness direction D1 of the mounting substrate 9 herein refers to the geometrical center of the mounting substrate 9 viewed in plan. In a case that the perimeter 94 of the mounting substrate 9 viewed in plan is rectangular in shape, a point of intersection of two diagonal lines of the rectangle defined by the perimeter 94 is the center of the mounting substrate 9 viewed in plan.

The first matching element 5A is adjacent to the first filter 3A. This means that the first matching element 5A and the first filter 3A are arranged side by side with no circuit element (none of the second filter 3B, the third filter 3C, the fourth filter 3D, the second matching element 5B, the third matching element 5C, and the fourth matching element 5D) being disposed between the first matching element 5A and the first filter 3A when viewed in plan in the thickness direction D1 of the mounting substrate 9. The first matching element 5A is adjacent to the first filter 3A in the second direction D2 when viewed in plan in the thickness direction D1 of the mounting substrate 9. The first terminal 51 of the first matching element 5A is in line with the output terminal 32 of the first filter 3A in the second direction D2. The first terminal 51 and the second terminal 52 of the first matching element 5A are in alignment in the third direction D3.

The second matching element 5B is adjacent to the second filter 3B. This means that the second matching element 5B and the second filter 3B are arranged side by side with no circuit element (none of the first filter 3A, the third filter 3C, the fourth filter 3D, the first matching element 5A, the third matching element 5C, and the fourth matching element 5D) being disposed between the second matching element 5B and the second filter 3B when viewed in plan in the thickness direction D1 of the mounting substrate 9. The second matching element 5B is adjacent to the second filter 3B in the second direction D2 when viewed in plan in the thickness direction D1 of the mounting substrate 9. The first terminal 51 of the second matching element 5B is in line with the output terminal 32 of the second filter 3B in the second direction D2. The first terminal 51 and the second terminal 52 of the second matching element 5B are in alignment in the third direction D3.

The third matching element 5C is adjacent to the third filter 3C. This means that the third matching element 5C and the third filter 3C are arranged side by side with no circuit element (none of the first filter 3A, the second filter 3B, the fourth filter 3D, the first matching element 5A, the second matching element 5B, and the fourth matching element 5D) being disposed between the third matching element 5C and the third filter 3C when viewed in plan in the thickness direction D1 of the mounting substrate 9. The third matching element 5C is adjacent to the third filter 3C in the second direction D2 when viewed in plan in the thickness direction D1 of the mounting substrate 9. The first terminal 51 of the third matching element 5C is in line with the output terminal 32 of the third filter 3C in the second direction D2. The first terminal 51 and the second terminal 52 of the third matching element 5C are in alignment in the third direction D3.

The fourth matching element 5D is adjacent to the fourth filter 3D. This means that the fourth matching element 5D and the fourth filter 3D are arranged side by side with no circuit element (none of the first filter 3A, the second filter 3B, the third filter 3C, the first matching element 5A, the second matching element 5B, and the third matching element 5C) being disposed between the fourth matching element 5D and the fourth filter 3D when viewed in plan in the thickness direction D1 of the mounting substrate 9. The fourth matching element 5D is adjacent to the fourth filter 3D in the second direction D2 when viewed in plan in the thickness direction D1 of the mounting substrate 9. The first terminal 51 of the fourth matching element 5D is in line with the output terminal 32 of the fourth filter 3D in the second direction D2. The first terminal 51 and the second terminal 52 of the fourth matching element 5D are in alignment in the third direction D3.

When viewed in plan in the thickness direction D1 of the mounting substrate 9, the input terminals 31 of the four filters 3 are located in a first region A1, which includes the center of the electronic component 30. When viewed in plan in the thickness direction D1 of the mounting substrate 9, the output terminals 32 of the four filters 3 are located in a second region A2, which is located between the first region A1 and the perimeter 303 of the electronic component 30. Each of the four filters 3 is partially located in the first region A1. The first region A1 is substantially rectangular in shape. The first region A1 coincides with the central portion of the electronic component 30 in the second direction D2. Each of the filters 3 adjacent to each other in the third direction D3 is partially located in the second region A2. The second region A2 coincides with end portions of the electronic component 30 in the second direction D2 and is discretely located away from the first region A1. The second region A2 is located between the first region A1 and the perimeter 303 of the electronic component 30 in the second direction D2.

The input terminal 31 of the first filter 3A is provided to a first end portion of the first filter 3A when viewed in plan in the thickness direction D1 of the mounting substrate 9. The first end portion of the first filter 3A is close to the second filter 3B. The output terminal 32 of the first filter 3A is provided to a second end portion of the first filter 3A when viewed in plan in the thickness direction D1 of the mounting substrate 9. The second end portion of the first filter 3A is remote from the second filter 3B. The first end portion of the first filter 3A is located in the first region A1. The second end portion of the first filter 3A is located in the second region A2.

The input terminal 31 of the second filter 3B is provided to a first end portion of the second filter 3B when viewed in plan in the thickness direction D1 of the mounting substrate 9. The first end portion of the second filter 3B is close to the first filter 3A. The output terminal 32 of the second filter 3B is provided to a second end portion of the second filter 3B when viewed in plan in the thickness direction D1 of the mounting substrate 9. The second end portion of the second filter 3B is remote from the first filter 3A. The first end portion of the second filter 3B is located in the first region A1. The second end portion of the second filter 3B is located in the second region A2.

The input terminal 31 of the third filter 3C is provided to a first end portion of the third filter 3C when viewed in plan in the thickness direction D1 of the mounting substrate 9. The first end portion of the third filter 3C is close to the fourth filter 3D. The output terminal 32 of the third filter 3C is provided to a second end portion of the third filter 3C when viewed in plan in the thickness direction D1 of the mounting substrate 9. The second end portion of the third filter 3C is remote from the fourth filter 3D. The first end portion of the third filter 3C is located in the first region A1. The second end portion of the third filter 3C is located in the second region A2.

The input terminal 31 of the fourth filter 3D is provided to a first end portion of the fourth filter 3D when viewed in plan in the thickness direction D1 of the mounting substrate 9. The first end portion of the fourth filter 3D is close to the third filter 3C. The output terminal 32 of the fourth filter 3D is provided to a second end portion of the fourth filter 3D when viewed in plan in the thickness direction D1 of the mounting substrate 9. The second end portion of the fourth filter 3D is remote from the third filter 3C. The first end portion of the fourth filter 3D is located in the first region A1. The second end portion of the fourth filter 3D is located in the second region A2.

When viewed in plan in the thickness direction D1 of the mounting substrate 9, the IC component 10 includes a first end portion 101, a second end portion 102, and a central portion 110, which is located between the first end portion 101 and the second end portion 102 in the direction in which the first filter 3A and the second filter 3B are arranged side by side. When the IC component 10 is viewed in plan in the thickness direction D1 of the mounting substrate 9, the first outer electrode 111, the second outer electrode 112, the third outer electrode 113, and the fourth outer electrode 114 are arranged in this order in the direction away from the central portion 110 toward the first end portion 101 of the IC component 10. The first outer electrode 111 is provided to the central portion 110. The second outer electrode 112 is provided to a first middle portion 104, which is located between the central portion 110 and the first end portion 101. The third outer electrode 113 and the fourth outer electrode 114 are provided to the first end portion 101. When the IC component 10 is viewed in plan in the thickness direction D1 of the mounting substrate 9, the fifth outer electrode 115, the sixth outer electrode 116, the seventh outer electrode 117, and the eighth outer electrode 118 are arranged in this order in the direction away from the central portion 110 toward the second end portion 102 of the IC component 10. The fifth outer electrode 115 is provided to the central portion 110. The sixth outer electrode 116 is provided to a second middle portion 105, which is located between the central portion 110 and the second end portion 102. The seventh outer electrode 117 and the eighth outer electrode 118 are provided to the second end portion 102.

The first outer electrode 111, the second outer electrode 112, the third outer electrode 113, and the fourth outer electrode 114 are arranged in a line. More specifically, the first outer electrode 111, the second outer electrode 112, the third outer electrode 113, and the fourth outer electrode 114 are arranged in a line in the second direction D2. The fifth outer electrode 115, the sixth outer electrode 116, the seventh outer electrode 117, and the eighth outer electrode 118 are arranged in a line. More specifically, the fifth outer electrode 115, the sixth outer electrode 116, the seventh outer electrode 117, and the eighth outer electrode 118 are arranged in a line in the second direction D2.

When the IC component 10 is viewed in plan in the thickness direction D1 of the mounting substrate 9, the ninth outer electrode 119, the tenth outer electrode 120, the eleventh outer electrode 121, and the twelfth outer electrode 122 are arranged in this order in the direction away from the central portion 110 toward the first end portion 101 of the IC component 10. The ninth outer electrode 119 is provided to the central portion 110 of the IC component 10. The tenth outer electrode 120 is provided to the first middle portion 104 located between the central portion 110 and the first end portion 101 of the IC component 10. The eleventh outer electrode 121 and the twelfth outer electrode 122 are provided to the first end portion 101 of the IC component 10. When the IC component 10 is viewed in plan in the thickness direction D1 of the mounting substrate 9, the thirteenth outer electrode 123, the fourteenth outer electrode 124, the fifteenth outer electrode 125, and the sixteenth outer electrode 126 are arranged in the stated order in the direction from the central portion 110 toward the second end portion 102 of the IC component 10. The thirteenth outer electrode 123 is provided to the central portion 110 of the IC component 10. The fourteenth outer electrode 124 is provided to the second middle portion 105 located between the central portion 110 and the second end portion 102 of the IC component 10. The fifteenth outer electrode 125 and the sixteenth outer electrode 126 are provided to the second end portion 102 of the IC component 10.

The ninth outer electrode 119, the tenth outer electrode 120, the eleventh outer electrode 121, and the twelfth outer electrode 122 are arranged in a line. More specifically, the ninth outer electrode 119, the tenth outer electrode 120, the eleventh outer electrode 121, and the twelfth outer electrode 122 are arranged in a line in the second direction D2. The thirteenth outer electrode 123, the fourteenth outer electrode 124, the fifteenth outer electrode 125, and the sixteenth outer electrode 126 are arranged in a line. More specifically, the thirteenth outer electrode 123, the fourteenth outer electrode 124, the fifteenth outer electrode 125, and the sixteenth outer electrode 126 are arranged in a line in the second direction D2.

The input terminal 31 of the first filter 3A and the second outer electrode 112 of the IC component 10 do not overlap each other when the radio-frequency module 100 is viewed in plan in the thickness direction D1 of the mounting substrate 9. The second outer electrode 112 is the first terminal 41A of the second switch 4 included in the IC component 10. The first terminal 41A is connected to the output terminal 32 of the first filter 3A. The input terminal 31 of the second filter 3B and the sixth outer electrode 116 of the IC component 10 do not overlap each other when the radio-frequency module 100 is viewed in plan in the thickness direction D1 of the mounting substrate 9. The sixth outer electrode 116 is the first terminal 41B of the second switch 4 included in the IC component 10. The first terminal 41B is connected to the output terminal 32 of the second filter 3B.

The input terminal 31 of the third filter 3C and the tenth outer electrode 120 of the IC component 10 do not overlap each other when the radio-frequency module 100 is viewed in plan in the thickness direction D1 of the mounting substrate 9. The tenth outer electrode 120 is the first terminal 41C of the second switch 4 included in the IC component 10. The first terminal 41C is connected to the output terminal 32 of the third filter 3C. The input terminal 31 of the fourth filter 3D and the fourteenth outer electrode 124 of the IC component 10 do not overlap each other when the radio-frequency module 100 is viewed in plan in the thickness direction D1 of the mounting substrate 9. The fourteenth outer electrode 124 is the first terminal 41D of the second switch 4 included in the IC component 10. The first terminal 41D is connected to the output terminal 32 of the fourth filter 3D.

The input terminal 31 of the first filter 3A and the first outer electrode 111 of the IC component 10 overlap each other when the radio-frequency module 100 is viewed in plan in the thickness direction D1 of the mounting substrate 9. That is, part of the input terminal 31 of the first filter 3A extends over part of the first outer electrode 111 of the IC component 10 of the radio-frequency module 100. Alternatively, part of the input terminal 31 of the first filter 3A may extend over the entirety of the first outer electrode 111 of the IC component 10. Still alternatively, the input terminal 31 of the first filter 3A may extend over part or the entirety of the first outer electrode 111. In some embodiments, the input terminal 31 of the first filter 3A and the first outer electrode 111 of the IC component 10 do not overlap each other when viewed in plan in the thickness direction D1 of the mounting substrate 9.

The input terminal 31 of the second filter 3B and the fifth outer electrode 115 of the IC component 10 overlap each other when the radio-frequency module 100 is viewed in plan in the thickness direction D1 of the mounting substrate 9. That is, part of the input terminal 31 of the second filter 3B extends over part of the fifth outer electrode 115 of the IC component 10 of the radio-frequency module 100. Alternatively, part of the input terminal 31 of the second filter 3B may extend over the entirety of the fifth outer electrode 115 of the IC component 10. Still alternatively, the input terminal 31 of the second filter 3B may extend over part or the entirety of the fifth outer electrode 115. In some embodiments, the input terminal 31 of the second filter 3B and the fifth outer electrode 115 of the IC component 10 do not overlap each other when viewed in plan in the thickness direction D1 of the mounting substrate 9.

The input terminal 31 of the third filter 3C and the ninth outer electrode 119 of the IC component 10 overlap each other when the radio-frequency module 100 is viewed in plan in the thickness direction D1 of the mounting substrate 9. That is, part of the input terminal 31 of the third filter 3C extends over part of the ninth outer electrode 119 of the IC component 10 of the radio-frequency module 100. Alternatively, part of the input terminal 31 of the third filter 3C may extend over the entirety of the ninth outer electrode 119 of the IC component 10. Still alternatively, the input terminal 31 of the third filter 3C may extend over part or the entirety of the ninth outer electrode 119. In some embodiments, the input terminal 31 of the third filter 3C and the ninth outer electrode 119 of the IC component 10 do not overlap each other when viewed in plan in the thickness direction D1 of the mounting substrate 9.

The input terminal 31 of the fourth filter 3D and the thirteenth outer electrode 123 of the IC component 10 overlap each other when the radio-frequency module 100 is viewed in plan in the thickness direction D1 of the mounting substrate 9. That is, part of the input terminal 31 of the fourth filter 3D extends over part of the thirteenth outer electrode 123 of the IC component 10 of the radio-frequency module 100. Alternatively, part of the input terminal 31 of the fourth filter 3D may extend over the entirety of the thirteenth outer electrode 123 of the IC component 10. Still alternatively, the input terminal 31 of the fourth filter 3D may extend over part or the entirety of the thirteenth outer electrode 123. In some embodiments, the input terminal 31 of the fourth filter 3D and the thirteenth outer electrode 123 of the IC component 10 do not overlap each other when viewed in plan in the thickness direction D1 of the mounting substrate 9.

(2) Effects (2.1) Radio-Frequency Module

The radio-frequency module 100 according to the present embodiment includes the mounting substrate 9, the electronic component 30, the IC component 10, and the external connection terminals 8. The mounting substrate 9 has the first principal surface 91 and the second principal surface 92 on opposite sides. The electronic component 30 is mounted on the first principal surface 91 of the mounting substrate 9. The IC component 10 is mounted on the second principal surface 92 of the mounting substrate 9. The external connection terminals 8 are disposed on the second principal surface 92 of the mounting substrate 9. The electronic component 30 overlaps the IC component 10 when viewed in plan in the thickness direction D1 of the mounting substrate 9. The electronic component 30 includes the four or more filters 3 whose pass bands are different frequency bands. The four or more filters 3 include the respective input terminals 31 and the respective output terminals 32. The IC component 10 includes the first switch 2 and the second switch 4. The first switch 2 is connected to the input terminals 31 of at least four of the four or more filters 3. The second switch 4 is connected to the output terminals 32 of the at least four filters 3. The input terminals 31 of the at least four filters 3 are located in the first region A1 including the center of the electronic component 30 when viewed in plan in the thickness direction D1 of the mounting substrate 9. The output terminals 32 of the at least four filters 3 are located in the second region A2 between the first region A1 and the perimeter 303 of the electronic component 30 when viewed in plan in the thickness direction D1 of the mounting substrate 9.

The radio-frequency module 100 according to the present embodiment affords improved isolation between the input terminal 31 and the output terminal 32 of each of the at least four filters 3. The radio-frequency module 100 also affords improved isolation between adjacent ones of the at least four filters 3.

When the radio-frequency module 100 according to the present embodiment is viewed in plan in the thickness direction D1 of the mounting substrate 9, the first outer electrode 111, the second outer electrode 112, the third outer electrode 113, and the fourth outer electrode 114 are arranged in this order in the direction away from the central portion 110 toward the first end portion 101 of the IC component 10. This layout enables shortening of each of the first trace W1, the second trace W2, the third trace W3, and the fourth trace W4 between the first filter 3A and the electronic component 30, thus eliminating or reducing the possibility that the characteristics of the radio-frequency module 100 will deteriorate due to electromagnetic coupling. When the radio-frequency module 100 according to the present embodiment is viewed in plan in the thickness direction D1 of the mounting substrate 9, the fifth outer electrode 115, the sixth outer electrode 116, the seventh outer electrode 117, and the eighth outer electrode 118 are arranged in this order in the direction away from the central portion 110 toward the second end portion 102 of the IC component 10. This layout enables shortening of each of the fifth trace W5, the sixth trace W6, the seventh trace W7, and the eighth trace W8 between the second filter 3B and the IC component 10, thus eliminating or reducing the possibility that the characteristics of the radio-frequency module 100 will deteriorate due to electromagnetic coupling.

When the radio-frequency module 100 according to the present embodiment is viewed in plan in the thickness direction D1 of the mounting substrate 9, the input terminal 31 of the first filter 3A does not overlap the second outer electrode 112 included in the IC component 10 and connected to the output terminal 32 of the first filter 3A. The radio-frequency module 100 thus affords improved isolation between the input terminal 31 of the first filter 3A and the second outer electrode 112 of the IC component 10 and, by extension, improved isolation between the input terminal 31 and the output terminal 32 of the first filter 3A. When the radio-frequency module 100 is viewed in plan in the thickness direction D1 of the mounting substrate 9, the input terminal 31 of the second filter 3B does not overlap the sixth outer electrode 116 included in the IC component 10 and connected to the output terminal 32 of the second filter 3B. The radio-frequency module 100 thus affords improved isolation between the input terminal 31 of the second filter 3B and the sixth outer electrode 116 of the IC component 10 and, by extension, improved isolation between the input terminal 31 and the output terminal 32 of the second filter 3B.

When the radio-frequency module 100 is viewed in plan in the thickness direction D1 of the mounting substrate 9, the input terminal 31 of the third filter 3C does not overlap the tenth outer electrode 120 included in the IC component 10 and connected to the output terminal 32 of the third filter 3C. The radio-frequency module 100 thus affords improved isolation between the input terminal 31 of the third filter 3C and the tenth outer electrode 120 of the IC component 10 and, by extension, improved isolation between the input terminal 31 and the output terminal 32 of the third filter 3C. When the radio-frequency module 100 is viewed in plan in the thickness direction D1 of the mounting substrate 9, the input terminal 31 of the fourth filter 3D does not overlap the fourteenth outer electrode 124 included in the IC component 10 and connected to the output terminal 32 of the fourth filter 3D. The radio-frequency module 100 thus affords improved isolation between the input terminal 31 of the fourth filter 3D and the fourteenth outer electrode 124 of the IC component 10 and, by extension, improved isolation between the input terminal 31 and the output terminal 32 of the fourth filter 3D.

(2.2) Communication Device

The communication device 200 according to the present embodiment includes the signal processing circuit 201 and the radio-frequency module 100. The signal processing circuit 201 is connected to the radio-frequency module 100.

The communication device 200 according to the present embodiment includes the radio-frequency module 100 and thus affords improved isolation between the input terminal 31 and the output terminal 32 of each of the four filters 3.

Figure 5:
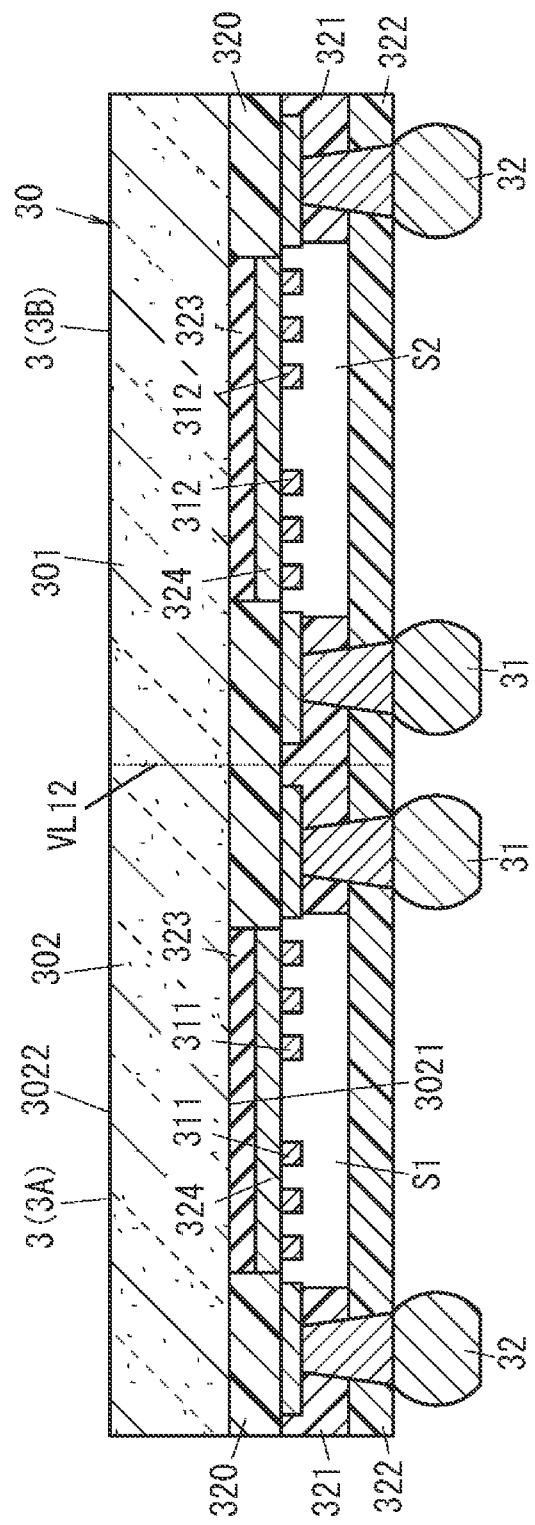
FIG. 5 is a sectional view of a first example of the electronic component included in the radio-frequency module.

(3) Other Examples of Electronic Component Included in Radio-Frequency Module (3.1) First Example of Electronic Component The piezoelectric effect exhibiting substrate 301 of the electronic component 30 included in the radio-frequency module 100 according to the embodiment above is a piezoelectric substrate. Alternatively, the piezoelectric effect exhibiting substrate 301 may have a multilayer structure. Referring to FIG. 5, a first example of the electronic component 30 includes a multilayer substrate including a substrate 302, a low-acoustic-velocity film 323, and a piezoelectric layer 324. Each constituent element of the first example of the electronic component 30 and the corresponding constituent element of the electronic component 30 included in the radio-frequency module 100 according to the embodiment above are denoted by the same reference sign, and redundant description thereof will be omitted where appropriate.

The piezoelectric effect exhibiting substrate 301 of the first example of the electronic component 30 includes the substrate 302, the low-acoustic-velocity film 323 on the substrate 302, and the piezoelectric layer 324 on the low-acoustic-velocity film 323. The substrate 302 has a first principal surface 3021 and a second principal surface 3022 on opposite sides in the thickness direction of the substrate 302. The low-acoustic-velocity film 323 is disposed on the first principal surface 3021 of the substrate 302.

The low-acoustic-velocity film 323 is discretely located away from the perimeter of the substrate 302 when viewed in plan in the thickness direction of the substrate 302.

The electronic component 30 also includes an insulating layer 320, which covers a region being part of the first principal surface 3021 of the substrate 302 and not being covered with the low-acoustic-velocity film 323. The insulating layer 320 has electrical insulation properties. The insulating layer 320 is partially disposed on the first principal surface 3021 of the substrate 302. The insulating layer 320 includes a first portion surrounding the first IDT electrodes 311, a second portion surrounding the second IDT electrodes 312, a third portion surrounding the third IDT electrodes 313 (see FIG. 3B), and a fourth portion surrounding the fourth IDT electrodes 314 (see FIG. 3B). Part of the insulating layer 320 extends over a peripheral portion of the piezoelectric layer 324 viewed in plan in the thickness direction of the substrate 302. The piezoelectric layer 324 and the low-acoustic-velocity film 323 have the respective peripheral surfaces covered with the insulating layer 320. The insulating layer 320 is made of, for example, an epoxy resin or polyimide.

The piezoelectric layer 324 is made of, for example, lithium niobate or lithium tantalate. The acoustic velocity of the bulk wave propagating through the low-acoustic-velocity film 323 is lower than the acoustic velocity of the bulk wave propagating through the piezoelectric layer 324. The low-acoustic-velocity film 323 is made of, for example, silicon oxide. Alternatively, the low-acoustic-velocity film 323 may be made of at least one material selected from the group consisting of tantalum oxide, a compound formed by adding fluorine to silicon oxide, a compound formed by adding carbon to silicon oxide, and a compound formed by adding boron to silicon oxide. The acoustic velocity of the bulk wave propagating through the substrate 302 is higher than the acoustic velocity of the acoustic wave propagating through the piezoelectric layer 324. The bulk wave concerned propagates through the substrate 302 faster than any other bulk wave propagating through the substrate 302.

The electronic component 30 may also include a high-acoustic-velocity film located between the substrate 302 and the low-acoustic-velocity film 323. The acoustic velocity of the bulk wave propagating through the high-acoustic-velocity film is higher than the acoustic velocity of the acoustic wave propagating through the piezoelectric layer 324. The high-acoustic-wave film is made of, for example, silicon nitride. Alternatively, the high-acoustic-wave film may be made of at least one material selected from the group consisting of diamond-like carbon, aluminum nitride, silicon carbide, silicon nitride, silicon oxynitride, silicon, sapphire, lithium tantalate, lithium niobate, quartz, zirconia, cordierite, mullite, steatite, forsterite, magnesia, and diamond.

The piezoelectric layer 324 has a thickness of about $3.5\lambda$ or less, where $\lambda$ denotes the wavelength of the acoustic wave and is determined by the electrode-finger period of the first IDT electrodes 311, the electrode-finger period of the second IDT electrodes 312, the electrode-finger period of the third IDT electrodes 313, and the electrode-finger period of the fourth IDT electrodes 314. The low-acoustic-velocity film 323 may, for example, have a thickness of about $2.0\lambda$ or less.

The electronic component 30 may, for example, include an adhesive layer disposed between the low-acoustic-velocity film 323 and the piezoelectric layer 324. The adhesive layer may, for example, be made of resin, such as an epoxy resin or a polyimide resin. The electronic component 30 may also include a dielectric film disposed between the low-acoustic-velocity film 323 and the piezoelectric layer 324, a dielectric film disposed on the piezoelectric layer 324, or a dielectric film disposed under the low-acoustic-velocity film 323.

(3.2) Second Example of Electronic Component

Figure 6:
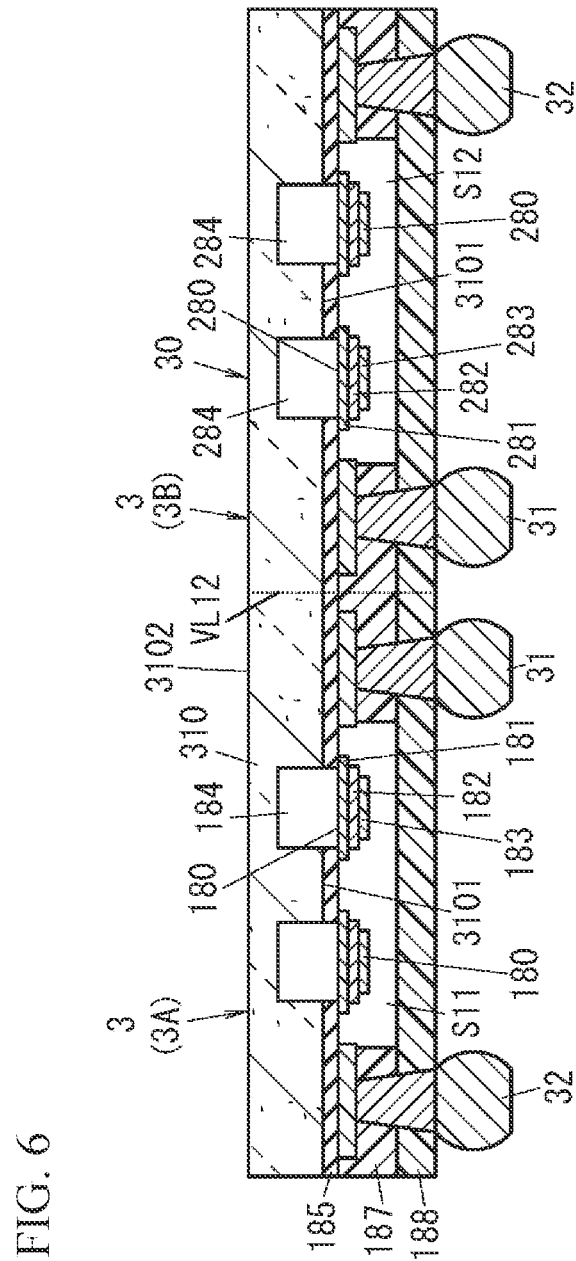
FIG. 6 is a sectional view of a second example of the electronic component included in the radio-frequency module.

The at least four filters 3 included in the electronic component 30 of the radio-frequency module 100 according to the embodiment above are surface acoustic wave filters. Alternatively, the filters may be bulk acoustic wave (BAW) filters. Referring to FIG. 6, a second example of the electronic component 30 includes BAW filters. Each constituent element of the second example of the electronic component 30 and the corresponding constituent element of the electronic component 30 included in the radio-frequency module 100 according to the embodiment above are denoted by the same reference sign, and redundant description thereof will be omitted where appropriate.

In place of the piezoelectric effect exhibiting substrate 301 included in the electronic component 30 of the radio-frequency module 100 according to the embodiment above, a substrate 310 is included in the second example of the electronic component 30. The substrate 310 has a first principal surface 3101 and a second principal surface 3102 on opposite sides in the thickness direction of the substrate 310. The substrate 310 of the second example of the electronic component 30 is a silicon substrate. The second example of the electronic component 30 includes an electrical insulating film 185, which is disposed on the first principal surface 3101 of the substrate 310. The electrical insulating film 185 is made of, for example, silicon oxide.

The first filter 3A includes first BAW resonators 180, which are acoustic wave filters. The second filter 3B includes second BAW resonators 280, which are acoustic wave filters. The third filter 3C includes third BAW resonators, which are acoustic wave filters. The fourth filter 3D includes fourth BAW resonators, which are acoustic wave filters.

The first BAW resonators 180 each includes a first electrode 181, a piezoelectric film 182, and a second electrode 183. The piezoelectric film 182 is disposed on the first electrode 181. The second electrode 183 is disposed on the piezoelectric film 182. The piezoelectric film 182 is made of, for example, aluminum nitride (AlN), scandium aluminum nitride (ScAlN), or lead zirconate titanate (PZT).

The first BAW resonators 180 each includes a cavity 184, which is located opposite the piezoelectric film 182 with the first electrode 181 therebetween. The ratio of the acoustic impedance of the first electrode 181 to the acoustic impedance of the medium located directly under the first electrode 181 is increased such that the transfer of acoustic wave energy toward the substrate 310 is inhibited. The electromechanical coupling coefficient of each first BAW resonator 180 is therefore higher than if the cavity 184 is not provided. The first BAW resonators 180 are film bulk acoustic resonators (FBARs).

The second BAW resonators 280 each includes a first electrode 281, a piezoelectric film 282, and a second electrode 283. The piezoelectric film 282 is disposed on the first electrode 281. The second electrode 283 is disposed on the piezoelectric film 282. The piezoelectric film 282 is made of, for example, AlN, ScAlN, or PZT.

The second BAW resonators 280 each includes a cavity 284, which is opposite the piezoelectric film 282 with the first electrode 281 therebetween. The second BAW resonators 280 are FBARs. The second BAW resonators 280 are structurally identical to the first BAW resonators 180.

Likewise, the third BAW resonators and the fourth BAW resonators are FBARs that are structurally identical to the first BAW resonators 180.

The second example of the electronic component 30 has a package structure that includes a spacer layer 187, a cover member 188, the input terminal 31 and the output terminal 32 of the first filter 3A, the input terminal 31 and the output terminal 32 of the second filter 3B, the input terminal 31 and the output terminal 32 of the third filter 3C, and the input terminal 31 and the output terminal 32 of the fourth filter 3D. The electronic component 30 also includes the ground terminal of the first filter 3A, the ground terminal of the second filter 3B, the ground terminal of the third filter 3C, and the ground terminal of the fourth filter 3D.

The spacer layer 187 is disposed on the electrical insulating film 185 or, more specifically, on the side opposite the side on which the first principal surface 3101 of the substrate 310 is located. The spacer layer 187 surrounds the first BAW resonators 180, the second BAW resonators 280, the third BAW resonators, and the fourth BAW resonators when viewed in the thickness direction of the substrate 310. The spacer layer 187 includes a frame portion that is substantially rectangular in shape when viewed in plan in the thickness direction of the substrate 310. The frame portion extends along the perimeter of the substrate 310. The spacer layer 187 has electrical insulation properties. The spacer layer 187 is made of, for example, an epoxy resin or polyimide. The cover member 188 is flat and plate-like in shape. The cover member 188 is disposed on the spacer layer 187 and faces the electrical insulating film 185 in the thickness direction of the substrate 310. The first BAW resonators 180, the second BAW resonators 280, the third BAW resonators, and the fourth BAW resonators are located within the cover member 188 when viewed in the thickness direction of the substrate 310. The cover member 188 is located away from the first BAW resonators 180, the second BAW resonators 280, the third BAW resonators, and the fourth BAW resonators in the thickness direction of the substrate 310. The cover member 188 has electrical insulation properties. The cover member 188 is made of, for example, an epoxy resin or polyimide. The first filter 3A includes a first space S11, which is located between the cover member 188 and the first BAW resonators 180 on the electrical insulating film 185. The second filter 3B includes a second space S12, which is located between the cover member 188 and the second BAW resonators 280 on the electrical insulating film 185. The third filter 3C includes a third space, which is located between the cover member 188 and the third BAW resonators 180 on the electrical insulating film 185. The fourth filter 3D includes a fourth space, which is located between the cover member 188 and the fourth BAW resonators 180 on the electrical insulating film 185. The input terminal 31 and the output terminal 32 of each filter 3 are exposed at a surface of the cover member 188.

(3.3) Third Example of Electronic Component

Figure 7:
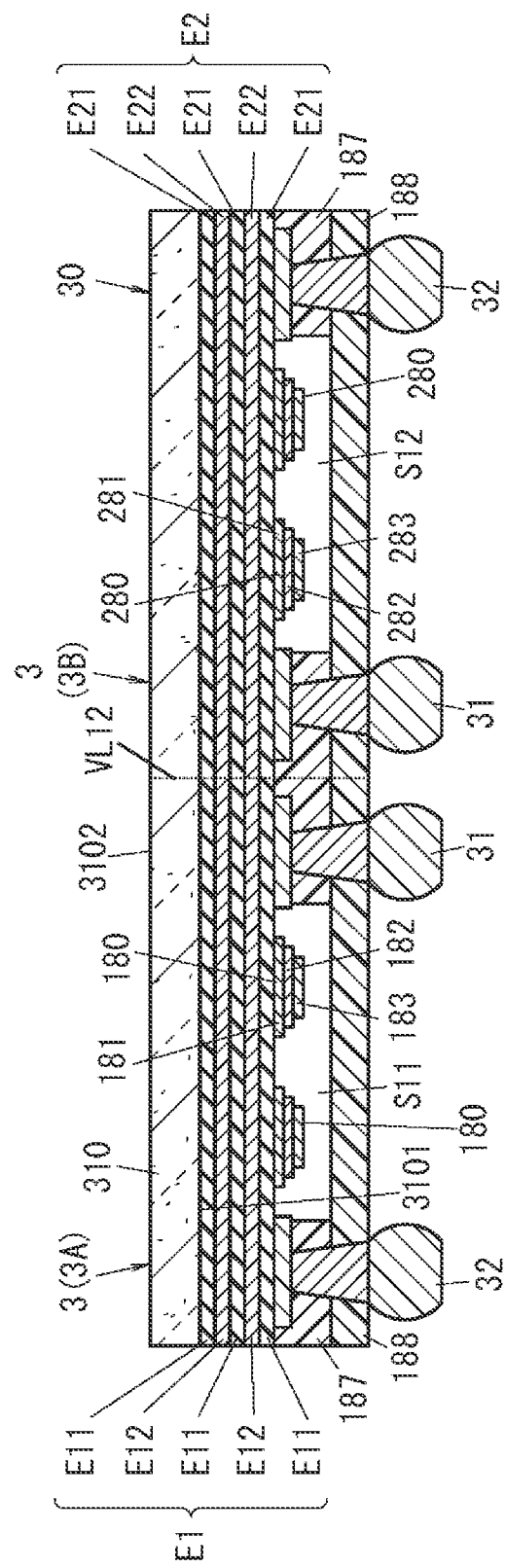
FIG. 7 is a sectional view of a third example of the electronic component included in the radio-frequency module.

Referring to FIG. 7, a third example of the electronic component 30 differs from the second example of the electronic component 30 in that an acoustic reflection layer E1 is disposed between the substrate 310 and the first electrodes 181 of the first BAW resonators 180.

The acoustic reflection layer E1 is disposed on the first principal surface 3101 of the substrate 310. The first electrodes 181 are disposed on the acoustic reflection layer E1. The acoustic reflection layer E1 includes at least one low-acoustic-impedance layer E11 and at least one high-acoustic-impedance layer E12. In the example illustrated herein, the acoustic reflection layer E1 includes three low-acoustic-impedance layers E11 and two high-acoustic-impedance layers E12. The acoustic impedance of the low-acoustic-impedance layers E11 is lower than the acoustic impedance of the high-acoustic-impedance layers E12. The first BAW resonators 180 included in the third example of the electronic component 30 are solidly mounted resonators (SMRs). The high-acoustic-impedance layers E12 are made of, for example, platinum. The low-acoustic-impedance layers E11 are made of, for example, silicon oxide. The material of the high-acoustic-impedance layers E12 is not limited to platinum. The high-acoustic-impedance layers E12 may be made of metal, such as tungsten or tantalum. Alternatively, the high-acoustic-impedance layers E12 may be made of an insulating material. It is not required that the individual high-acoustic-impedance layers E12 be made of the same material; that is, the individual high-acoustic-impedance layers E12 may be made of different materials. Likewise, the individual low-acoustic-impedance layers E11 may be made of different materials. The high-acoustic-impedance layers E12 may be equal in number to the low-acoustic-impedance layers E11.

The third example of the electronic component 30 differs from the second example of the electronic component 30 also in that an acoustic reflection layer E2 is disposed between the substrate 310 and the first electrodes 281 of the second BAW resonators 280.

The acoustic reflection layer E2 is disposed on the first principal surface 3101 of the substrate 310. The first electrodes 281 are disposed on the acoustic reflection layer E2. The acoustic reflection layer E2 includes at least one low-acoustic-impedance layer E21 and at least one high-acoustic-impedance layer E22. In the example illustrated herein, the acoustic reflection layer E2 includes three low-acoustic-impedance layers E21 and two high-acoustic-impedance layers E22. The acoustic impedance of the low-acoustic-impedance layers E21 is lower than the acoustic impedance of the high-acoustic-impedance layers E22. The third example of the second BAW resonators 280 included in the electronic component 30 are SMRs. The high-acoustic-impedance layers E22 are made of, for example, platinum. The low-acoustic-impedance layers E21 are made of, for example, silicon oxide. The material of the high-acoustic-impedance layers E22 is not limited to platinum. The high-acoustic-impedance layers E22 may be made of metal, such as tungsten or tantalum. Alternatively, the high-acoustic-impedance layers E22 may be made of an insulating material. It is not required that the individual high-acoustic-impedance layers E22 be made of the same material; that is, the individual high-acoustic-impedance layers E22 may be made of different materials. Likewise, the individual low-acoustic-impedance layers E21 may be made of different materials. The high-acoustic-impedance layers E22 may be equal in number to the low-acoustic-impedance layers E21. The acoustic reflection layer E2 is structurally identical to the acoustic reflection layer E1.

Alternatively, the acoustic reflection layer E2 may be structurally different from the acoustic reflection layer E1.

The third BAW resonators and the fourth BAW resonators are SMRs that are structurally identical to the first BAW resonators 180.

(4) Modifications

Figure 8:
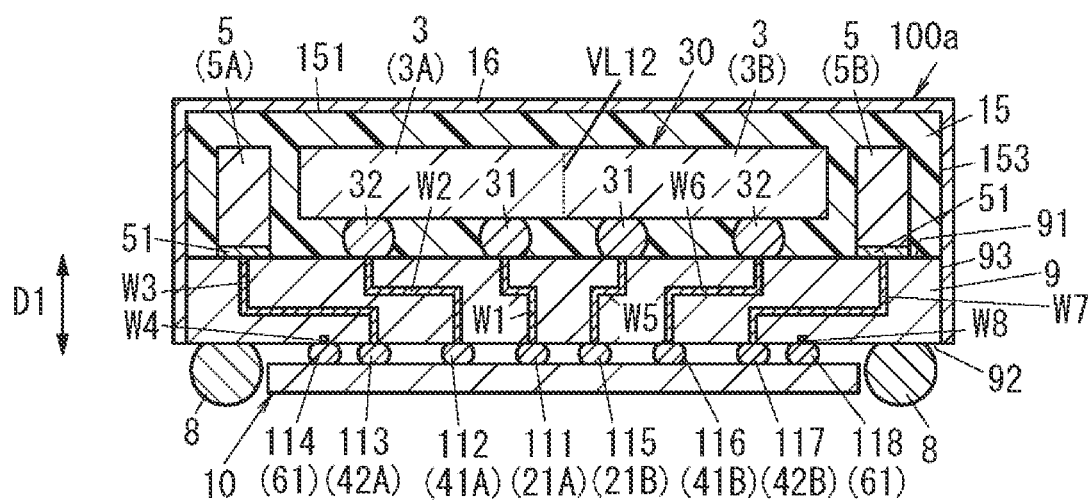
FIG. 8 is a sectional view of a radio-frequency module according to a modification of the embodiment.

The following describes a radio-frequency module 100a according to a modification of the above-mentioned embodiment with reference to FIG. 8. Each constituent element of the radio-frequency module 100a according to this modification and the corresponding constituent element of the radio-frequency module 100 according to the above-mentioned embodiment are denoted by the same reference sign, and redundant description thereof will be omitted.

The radio-frequency module 100a according to this modification differs from the radio-frequency module 100 according to the above-mentioned embodiment in that the external connection terminals 8 are ball bumps. The radio-frequency module 100a according to this modification differs from the radio-frequency module 100 according to the above-mentioned embodiment also in that the second resin layer 17 (see FIG. 1B) is not included. The radio-frequency module 100a according to this modification may include an underfill portion in a gap between the second principal surface 92 of the mounting substrate 9 and the IC component 10 mounted on the second principal surface 92 of the mounting substrate 9.

The ball bumps provided as the external connection terminals 8 are made of, for example, gold, copper, or solder.

Some of the external connection terminals 8 may be ball bumps, and the other external connection terminals 8 may be columnar electrodes.

As with the radio-frequency module 100 according to the above-mentioned embodiment, the radio-frequency module 100a according to this modification affords improved isolation between the input terminal 31 and the output terminal 32 of each of the at least four filters 3.

Other Modifications

These embodiments, which have been described so far, are merely example embodiments of the present disclosure. Various alterations may be made to these embodiments in accordance with, for example, designs in such a manner that the objective of the present disclosure is achieved. For example, constituent elements in different embodiments may be used in combination as appropriate.

It is not required that four filters 3 be included in the electronic component 30; that is, the electronic component 30 may include four or more filters 3. It is not required that the four or more filters 3 be ladder filters. The four or more filters 3 may, for example, be longitudinally coupled resonator-type surface acoustic wave filters. It is required that the input terminal 31 and the output terminal 32 of at least four of the four or more filters 3 be located in the first region A1 and the second region A2, respectively.

The acoustic wave filters described above are of the type that uses surface acoustic waves or bulk acoustic waves. Alternatively, the acoustic wave filters may be of the type that uses boundary acoustic waves or plate waves.

The electronic component 30 includes elements encased in a package structure. Alternatively, the electronic component 30 may be a bare chip, in which case the input terminals 31 and the output terminals 32 of the filters 3 included in the electronic component 30 are constituent elements of the bare chip.

It is not required that the FBARs included as the first BAW resonators 180 and the second BAW resonators 280 of the BAW filters have the structure illustrated in FIG. 6. For example, it is not required that the first BAW resonators 180 have the cavities 184 in the substrate 310. Cavities may be provided between part of the electrical insulating film 185 and the first principal surface 3101 of the substrate 310 instead. In this case, the first electrodes 181 may be disposed on the electrical insulating film 185 or, more specifically, on the side opposite the side on which the cavities are located. The piezoelectric film 182 may be disposed on the first electrodes 181. The second electrodes 183 may be disposed on the piezoelectric film 182. The cavities between part of the electrical insulating film 185 and the first principal surface 3101 of the substrate 310 may be formed by sacrificial layer etching. Likewise, it is not required that the second BAW resonators 280 have the cavities 284 in the substrate 310. Cavities may be provided between part of the electrical insulating film 185 and the first principal surface 3101 of the substrate 310 instead. In this case, the first electrodes 281 may be disposed on the electrical insulating film 185 or, more specifically, on the side opposite the side on which the cavities are located. The piezoelectric film 282 may be disposed on the first electrodes 281. The second electrodes 283 may be disposed on the piezoelectric film 282. The cavities between part of the electrical insulating film 185 and the first principal surface 3101 of the substrate 310 may be formed by sacrificial layer etching. The third BAW resonators and the fourth BAW resonators are structurally identical to the first BAW resonators 180.

The first resin layer 15 of each of the radio-frequency modules 100 and 100a covers the principal surface of the electronic component 30 farther than the other principal surface of the electronic component 30 from the mounting substrate 9. Alternatively, the principal surface of the electronic component 30 farther than the other principal surface of the electronic component 30 from the mounting substrate 9 may not be covered with the first resin layer 15 and may be at least partially in contact with the electrically conductive layer 16.

The communication device 200 may include the radio-frequency module 100a in place of the radio-frequency module 100.

Aspects of Disclosure

The following aspects of the present disclosure are disclosed herein.

According to a first aspect, a radio-frequency module (100; 100a) includes a mounting substrate (9), an electronic component (30), an IC component (10), and external connection terminals (8). The mounting substrate (9) has a first principal surface (91) and a second principal surface (92) on opposite sides. The electronic component (30) is mounted on the first principal surface (91) of the mounting substrate (9). The IC component (10) is mounted on the second principal surface (92) of the mounting substrate (9). The external connection terminals (8) are disposed on the second principal surface (92) of the mounting substrate (9). The electronic component (30) overlaps the IC component (10) when viewed in plan in a thickness direction (D1) of the mounting substrate (9). The electronic component (30) includes four or more filters (3) whose pass bands are different frequency bands. The four or more filters (3) each includes an input terminal (31) and an output terminal (32). The IC component (10) includes a first switch (2) and a second switch (4). The first switch (2) is connected to the input terminals (31) of at least four of the four or more filters (3). The second switch (4) is connected to the output terminals (32) of the at least four filters (3). The input terminals (31) of the at least four filters (3) are located in a first region (A1) including a center of the electronic component (30) when viewed in plan in the thickness direction (D1) of the mounting substrate (9). The output terminals (32) of the at least four filters (3) are located in a second region (A2) between the first region (A1) and a perimeter (303) of the electronic component (30) when viewed in plan in the thickness direction (D1) of the mounting substrate (9).

The radio-frequency module (100; 100a) according to the first aspect affords improved isolation between the input terminal (31) and the output terminal (32) of each of the at least four filters (3).

According to a second aspect, the radio-frequency module (100; 100a) according to the first aspect further includes a first matching element (5A) and a second matching element (5B). The IC component (10) includes a first low-noise amplifier (6A) and a second low-noise amplifier (6B). The first low-noise amplifier (6A) is connected to the second switch (4) with the first matching element (5A) therebetween. The second low-noise amplifier (6B) is connected to the second switch (4) with the second matching element (5B) therebetween. The electronic component (30) extends past a center of the mounting substrate (9) when viewed in plan in the thickness direction (D1) of the mounting substrate (9). The first matching element (5A) and the second matching element (5B) are each located between the electronic component (30) and a perimeter (94) of the mounting substrate (9) when viewed in plan in the thickness direction (D1) of the mounting substrate (9).

According to a third aspect, the IC component (10) of the radio-frequency module (100; 100a) according to the second aspect includes outer electrodes. The at least four filters (3) include a first filter (3A) and a second filter (3B). The outer electrodes include a first outer electrode (111), a second outer electrode (112), a third outer electrode (113), a fourth outer electrode (114), a fifth outer electrode (115), a sixth outer electrode (116), a seventh outer electrode (117), and an eighth outer electrode (118). The first outer electrode (111) is connected to the input terminal (31) of the first filter (3A). The second outer electrode (112) is connected to the output terminal (32) of the first filter (3A). The third outer electrode (113) is connected to the first matching element (5A). The fourth outer electrode (114) is connected to the first low-noise amplifier (6A). The fifth outer electrode (115) is connected to the input terminal (31) of the second filter (3B). The sixth outer electrode (116) is connected to the output terminal (32) of the second filter (3B). The seventh outer electrode (117) is connected to the second matching element (5B). The eighth outer electrode (118) is connected to the second low-noise amplifier (6B). When viewed in plan in the thickness direction (D1) of the mounting substrate (9), the IC component (10) includes a first end portion (101), a second end portion (102), and a central portion (110) that is located between the first end portion (101) and the second end portion (102) in a direction in which the first filter (3A) and the second filter (3B) are arranged side by side. The first outer electrode (111), the second outer electrode (112), the third outer electrode (113), and the fourth outer electrode (114) are arranged in this order in a direction away from the central portion (110) toward the first end portion (101) of the IC component (10) when viewed in plan in the thickness direction (D1) of the mounting substrate (9). The fifth outer electrode (115), the sixth outer electrode (116), the seventh outer electrode (117), and the eighth outer electrode (118) are arranged in this order in a direction away from the central portion (110) toward the second end portion (102) of the IC component (10) when viewed in plan in the thickness direction (D1) of the mounting substrate (9).

The radio-frequency module (100; 100a) according to the third aspect enables shortening of traces between the first filter (3A) and the IC component (10) and shortening of traces between the second filter (3B) and the IC component (10). This eliminates or reduces the possibility that the characteristics of the radio-frequency module (100; 100a) according to the third aspect will deteriorate due to electromagnetic coupling.

According to a fourth aspect, the radio-frequency module (100; 100a) according to the third aspect is as follows. When viewed in plan in the thickness direction (D1) of the mounting substrate (9), the input terminal (31) of the first filter (3A) does not overlap the second outer electrode (112) included in the IC component (10) and connected to the output terminal (32) of the first filter (3A). When viewed in plan in the thickness direction (D1) of the mounting substrate (9), the input terminal (31) of the second filter (3B) does not overlap the sixth outer electrode (116) included in the IC component (10) and connected to the output terminal (32) of the second filter (3B).

The radio-frequency module (100; 100a) according to the fourth aspect affords improved isolation between the input terminal (31) of the first filter (3A) and the second outer electrode (112) of the IC component (10) and, by extension, improved isolation between the input terminal (31) and the output terminal (32) of the first filter (3A). The radio-frequency module (100; 100a) according to the fourth aspect also affords improved isolation between the input terminal (31) of the second filter (3B) and the sixth outer electrode (116) of the IC component (10) and, by extension, improved isolation between the input terminal (31) and the output terminal (32) of the second filter (3B).

According to a fifth aspect, the first outer electrode (111), the second outer electrode (112), the third outer electrode (113), and the fourth outer electrode (114) of the radio-frequency module (100; 100a) according to the third or fourth aspect are arranged in a line, and the fifth outer electrode (115), the sixth outer electrode (116), the seventh outer electrode (117), and the eighth outer electrode (118) of the radio-frequency module (100; 100a) according to the third or fourth aspect are arranged in a line.

The radio-frequency module (100; 100a) according to the fifth aspect enables shortening of traces between the first filter (3A) and the IC component (10) and shortening of traces between the second filter (3B) and the IC component (10).

According to a sixth aspect, the at least four filters (3) in the radio-frequency module (100; 100a) according to any one of the first to fifth aspects include a first filter (3A), a second filter (3B), a third filter (3C), and a fourth filter (3D). The first filter (3A) is a filter whose pass band is a first frequency band. The second filter (3B) is a filter whose pass band is a second frequency band different from the first frequency band. The third filter (3C) is a filter whose pass band is a third frequency band different from each of the first and second frequency bands. The fourth filter (3D) is a filter whose pass band is a fourth frequency band different from each of the first, second, and third frequency bands.

According to a seventh aspect, the first frequency band, the second frequency band, the third frequency band, and the fourth frequency band for the radio-frequency module (100; 100a) according to the sixth aspect are four communication bands selected from the group consisting of Band 8, Band 26, Band 20, Band 28A, Band 14, Band 13, Band 12, Band 29, Band 71, Band 28, n5, n8, n71, n12, n14, n20, n26, n28, and n29.

According to an eighth aspect, the first filter (3A), the second filter (3B), the third filter (3C), the fourth filter (3D) in the radio-frequency module (100; 100a) according to the sixth or seventh aspect are acoustic wave filters.

According to a ninth aspect, the electronic component (30) of the radio-frequency module (100; 100a) according to the eighth aspect includes a piezoelectric effect exhibiting substrate (301) that is shared by the at least four filters (3). The first filter (3A) includes first IDT electrodes (311) on the piezoelectric effect exhibiting substrate (301). The second filter (3B) includes second IDT electrodes (312) on the piezoelectric effect exhibiting substrate (301). The third filter (3C) includes third IDT electrodes (313) on the piezoelectric effect exhibiting substrate (301). The fourth filter (3D) includes fourth IDT electrodes (314) on the piezoelectric effect exhibiting substrate (301).

According to a tenth aspect, a communication device (200) includes the radio-frequency module (100; 100a) according to any one of the first to ninth aspects and a signal processing circuit (201). The signal processing circuit (201) is connected to the radio-frequency module (100; 100a).

The communication device (200) according to the tenth aspect affords improved isolation between the input terminal (31) and the output terminal (32) of each of the at least four filters (3).

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio-frequency module, comprising:
   a mounting substrate having a first principal surface and a second principal surface on opposite sides;
   an electronic component mounted on the first principal surface of the mounting substrate;
   an integrated circuit (IC) component mounted on the second principal surface of the mounting substrate; and
   external connection terminals on the second principal surface of the mounting substrate,
   wherein the electronic component overlaps the IC component when the mounting substrate is viewed in a plan view in a thickness direction of the mounting substrate,
   wherein the electronic component comprises four or more filters, the four or more filter each having pass bands of different frequency bands,
   wherein the four or more filters each comprise an input terminal and an output terminal,
   wherein the IC component comprises:
   a first switch connected to the input terminals of at least four of the four or more filters, and a second switch connected to the output terminals of the at least four filters, wherein the input terminals of the at least four filters are located in a first region of the plan view, the first region including a center of the electronic component, and the output terminals of the at least four filters are located in a second region of the plan view, the second region being between the first region and a perimeter of the electronic component.

2. The radio-frequency module according to claim 1, further comprising:

a first matching circuit element; and a second matching circuit element, wherein the IC component further comprises:

a first low-noise amplifier connected to the second switch, the first matching circuit element being connected between the first low-noise amplifier and the second switch, and a second low-noise amplifier connected to the second switch, the second matching circuit element being connected between the second low-noise amplifier and the second switch, wherein the electronic component extends past a center of the mounting substrate in the plan view, and wherein the first matching circuit element and the second matching circuit element are each located between the electronic component and a perimeter of the mounting substrate in the plan view.

3. The radio-frequency module according to claim 2, wherein the IC component further comprises outer electrodes, wherein the at least four filters comprise a first filter and a second filter, wherein the outer electrodes comprise:

a first outer electrode connected to the input terminal of the first filter, a second outer electrode connected to the output terminal of the first filter, a third outer electrode connected to the first matching circuit element, a fourth outer electrode connected to the first low-noise amplifier, a fifth outer electrode connected to the input terminal of the second filter, a sixth outer electrode connected to the output terminal of the second filter, a seventh outer electrode connected to the second matching circuit element, and an eighth outer electrode connected to the second low-noise amplifier, wherein in the plan view the IC component includes a first end portion, a second end portion, and a central portion that is located between the first end portion and the second end portion in a direction in which the first filter and the second filter are adjacently arranged, wherein in the plan view in a direction away from the central portion toward the first end portion of the IC component, the first outer electrode is closer to the central portion than the second outer electrode, the second outer electrode is closer to the central portion than the third outer electrode, and the third outer electrode is closer to the central portion than the fourth outer electrode, and wherein in the plan view in a direction away from the central portion toward the second end portion of the IC component, the fifth outer electrode is closer to the central portion than the sixth outer electrode, the sixth outer electrode is closer to the central portion than the seventh outer electrode, and the seventh outer electrode is closer to the central portion than the eighth outer electrode.

4. The radio-frequency module according to claim 3, wherein in the plan view the input terminal of the first filter does not overlap the second outer electrode, and wherein in the plan view the input terminal of the second filter does not overlap the sixth outer electrode.

5. The radio-frequency module according to claim 3, wherein the first outer electrode, the second outer electrode, the third outer electrode, and the fourth outer electrode are arranged in a line, and wherein the fifth outer electrode, the sixth outer electrode, the seventh outer electrode, and the eighth outer electrode are arranged in a line.

6. The radio-frequency module according to claim 1, wherein the at least four filters comprise a first filter, a second filter, a third filter, and a fourth filter, wherein a pass band of the first filter is a first frequency band, wherein a pass band of the second filter is a second frequency band different than the first frequency band, wherein a pass band of the third filter is a third frequency band different than each of the first and second frequency bands, and wherein a pass band of the fourth filter is a fourth frequency band different than each of the first, second, and third frequency bands.

7. The radio-frequency module according to claim 6, wherein the first frequency band, the second frequency band, the third frequency band, and the fourth frequency band are communication bands selected from the group consisting of: Band 8, Band 26, Band 20, Band 28A, Band 14, Band 13, Band 12, Band 29, Band 71, Band 28, n5, n8, n71, n12, n14, n20, n26, n28, and n29.

8. The radio-frequency module according to claim 6, wherein the first filter, the second filter, the third filter, and the fourth filter are acoustic wave filters.

9. The radio-frequency module according to claim 8, wherein the electronic component comprises a piezoelectric effect exhibiting substrate that is shared by the at least four filters, wherein the first filter comprises first interdigital transducer (IDT) electrodes on the piezoelectric effect exhibiting substrate, wherein the second filter comprises second IDT electrodes on the piezoelectric effect exhibiting substrate, wherein the third filter comprises third IDT electrodes on the piezoelectric effect exhibiting substrate, and wherein the fourth filter comprises fourth IDT electrodes on the piezoelectric effect exhibiting substrate.

10. A communication device, comprising:

the radio-frequency module according to claim 1; and a signal processing circuit connected to the radio-frequency module.

* * * * *